(12) United States Patent
Bagchi

(10) Patent No.: US 8,548,409 B2
(45) Date of Patent: *Oct. 1, 2013

(54) MIMO RADIO INTERFACES

(75) Inventor: Amit G. Bagchi, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/621,152

(22) Filed: Sep. 15, 2012

(65) Prior Publication Data

US 2013/0010847 A1  Jan. 10, 2013

Related U.S. Application Data

(63) Continuation of application No. 12/637,318, filed on Dec. 14, 2009, now Pat. No. 8,295,797, which is a continuation of application No. 11/494,102, filed on Jul. 27, 2006, now Pat. No. 7,634,241.

(60) Provisional application No. 60/704,112, filed on Jul. 29, 2005.

(51) Int. Cl.
*H04B 1/18* (2006.01)

(52) U.S. Cl.
USPC ..................... 455/188.1; 455/234.1

(58) Field of Classification Search
USPC ............... 455/73, 78, 84, 552.1, 132, 232.1, 455/234.1, 234.2, 245.2, 250.1, 226.2, 188.1, 455/266, 340; 375/345
See application file for complete search history.

(56) References Cited

U.S. PATENT DOCUMENTS

| | | | | |
|---|---|---|---|---|
| 7,634,241 B2 * | 12/2009 | Bagchi | ....................... | 455/188.1 |
| 8,295,797 B2 * | 10/2012 | Bagchi | ....................... | 455/188.1 |
| 2006/0148437 A1 * | 7/2006 | Krivokapic | ................ | 455/232.1 |
| 2007/0129034 A1 * | 6/2007 | Adams et al. | ................. | 455/138 |
| 2008/0298450 A1 * | 12/2008 | Zhang et al. | .................. | 375/227 |

* cited by examiner

*Primary Examiner* — Nguyen Vo
(74) *Attorney, Agent, or Firm* — Garlick & Markison; Bruce E. Garlick

(57) ABSTRACT

A receiver front end includes a plurality of in-phase and quadrature phase receive processing blocks operable at first and second frequency bands and further includes a plurality of filtering and amplification blocks disposed within a corresponding ingoing signal path, a plurality of received signal strength indicator (RSSI) blocks coupled to receive an ingoing analog signal from a corresponding plurality of nodes disposed throughout the ingoing signal path, each of the plurality of RSSI blocks producing a signal strength indication, and wherein a baseband processor is operable to receive a selected signal strength indication and to produce at least one gain setting to at least one amplification block within the in-phase or quadrature phase receive processing blocks. In operation, the baseband processor receives a signal strength indication from each RSSI block to determine a total amount of gain and appropriate gain distribution within the receive signal path.

20 Claims, 15 Drawing Sheets

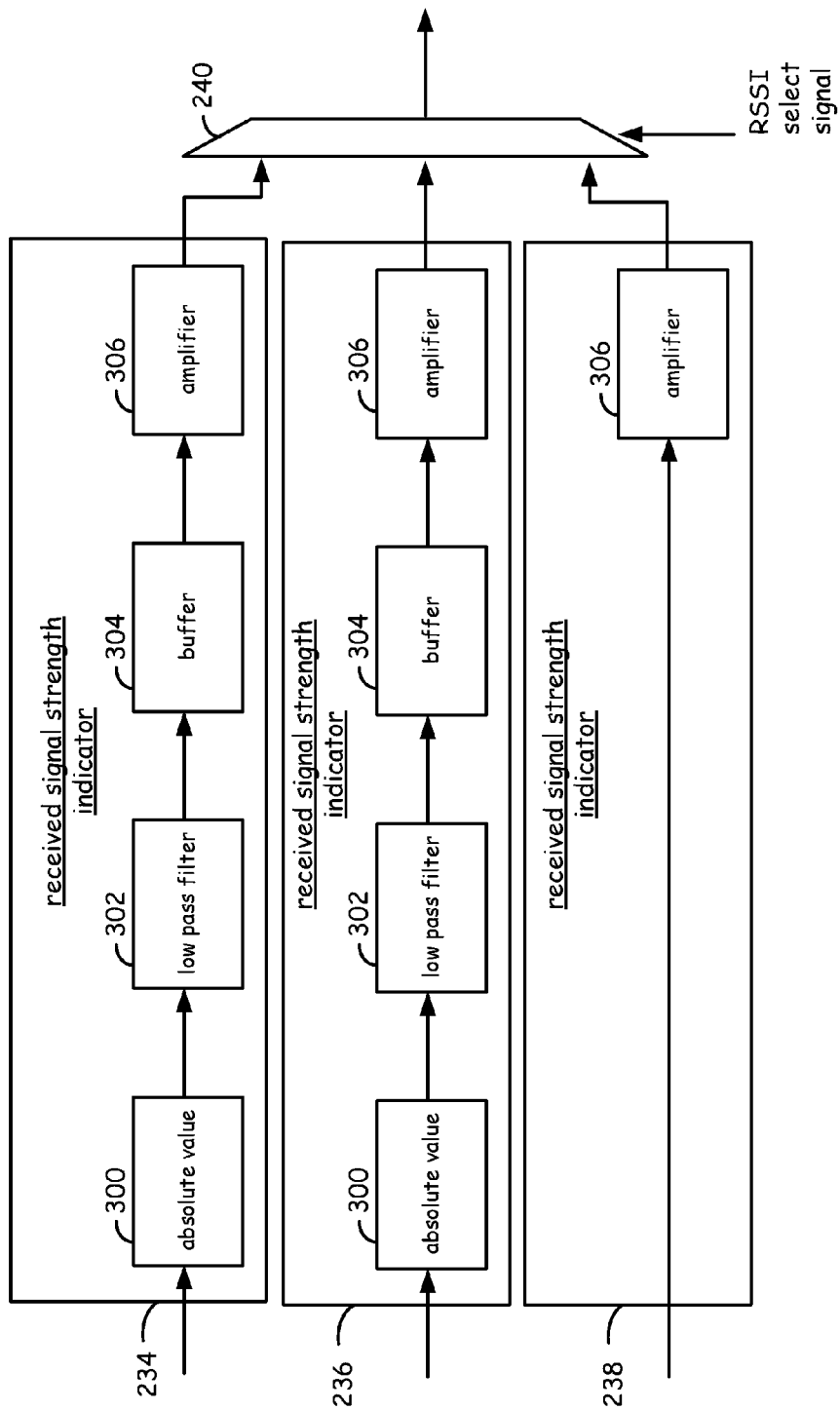

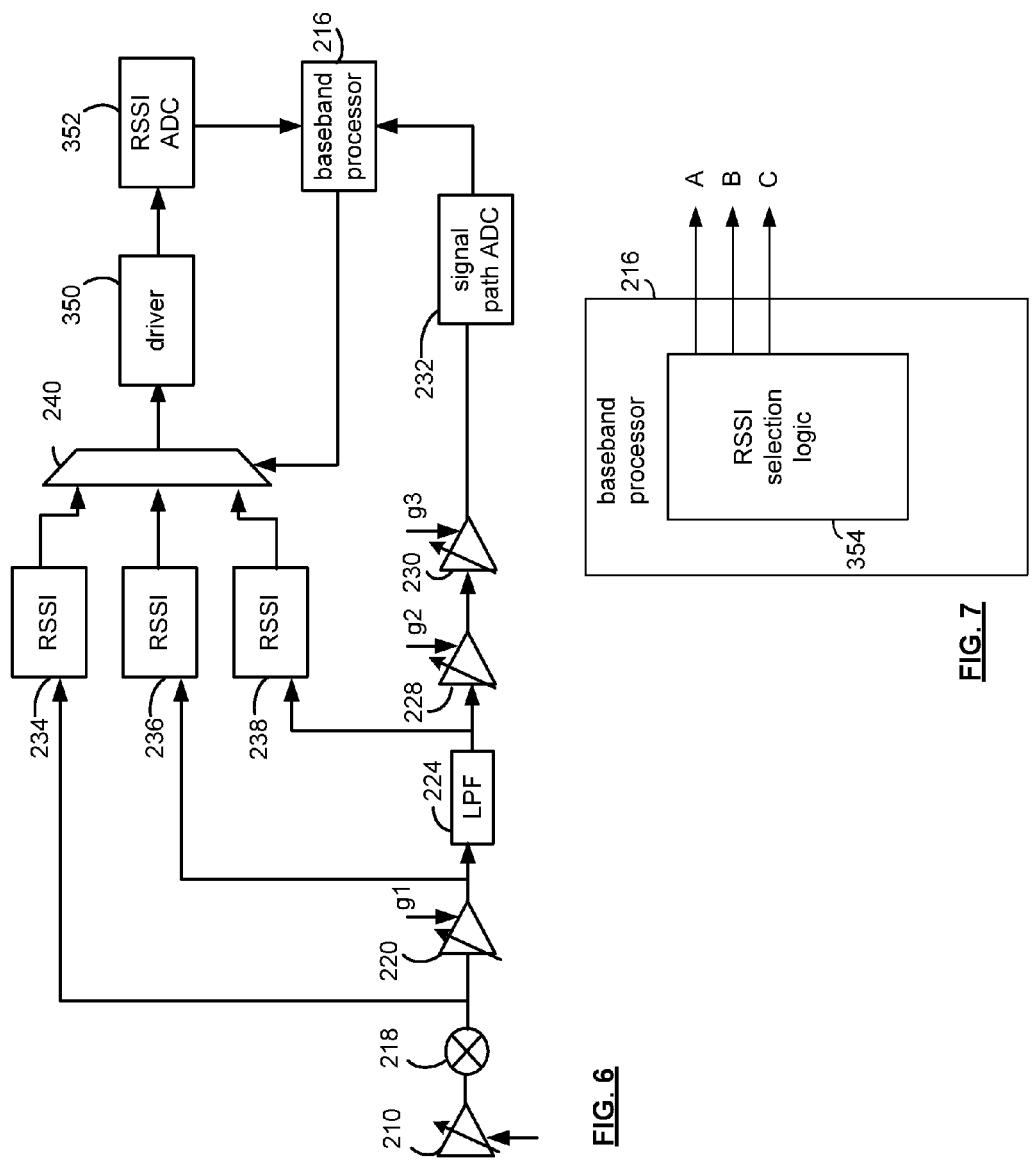

MIMO RADIO INTERFACES

CROSS REFERENCE TO RELATED APPLICATIONS

The present U.S. Utility Patent Application claims priority pursuant to 35 U.S.C. §120, as a continuation of U.S. Utility application Ser. No. 12/637,318, entitled "MIMO Radio Interfaces,", filed Dec. 14, 2009, pending, which claims priority pursuant to 35 U.S.C. §120, as a continuation of U.S. Utility application Ser. No. 11/494,102, entitled "MIMO Radio Interfaces,", filed Jul. 27, 2006, now U.S. Pat. No. 7,634,241, which claims priority pursuant to 35 U.S.C. §119(e) to U.S. Provisional Application Ser. No. 60/704,112, entitled "MIMO Radio Interfaces,", filed Jul. 29, 2005, expired, all of which are hereby incorporated herein by reference in their entirety and made part of the present U.S. Utility Patent Application for all purposes.

BACKGROUND

1. Technical Field

The present invention relates to wireless communications and, more particularly, to circuitry for determining received signal strength values and for controlling gain settings for amplifiers in the receive signal path.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

One common problem in processing a received signal in a receive signal path is that signal-to-noise ratios fluctuate according to an amount of present noise and/or according to fluctuations only in signal strength. At the same time, if an amplification level were left constant, then an amplified signal may experience clipping when noise levels exceed a certain threshold. To avoid this problem, it is possible to reduce amplification levels to avoid clipping even in situations where ambient noise levels are high. Unfortunately, however, this approach results in a received signal being amplified a lesser amount. Moreover, even without considering interference, an ingoing signal may vary in magnitude by a wide range. Accordingly, preset amplification levels would tend to under-amplify small scale signals and over-amplify large scale signals.

One design issue that is prevalent in designing a receiver relates to the effects of gain control upon signal detection. Stated differently, gain control and its detection are related in that detection will fail if a signal is clipped or not gained enough between the radio and the baseband processor. For example, if the cumulative sum of all amplification results in a signal being amplified too much, the signal will clip at an output analog-to-digital converter resulting in a loss of data. On the other hand, if a signal is not adequately amplified, then the output analog-to-digital converter will be unable to generate a digital signal that accurately reflects an in-going analog signal received at an antenna. Thus, the method and apparatus for determining an appropriate amount of gain to allow accurate signal detection is needed.

Additionally, it is a known technique to provide a training sequence in a preamble of a non-synchronous data packet. Because the training sequence includes a known pattern, a receiver may determine what types of compensation are required to accurately receive an ingoing RF signal. As data rates increase, however, the amount of time that a receiver has to properly adjust its radio front end amplification levels decreases thereby creating a need for a system and method that may respond to shorter training sequences. At the same time, there is a competing goal of designing circuits that are hardware efficient. As such, there is a need for a method and apparatus that efficiently but effectively adjust a radio front end within the required amount of time defined by a training sequence.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 5 is a functional block diagram that illustrates received signal strength indicator blocks according to one embodiment of the invention;

FIG. 6 is a functional block diagram of a received signal path with a plurality of RSSI blocks for providing select RSSI block signal strength indications according to one embodiment of the invention;

FIG. 7 is a functional block diagram illustrating a baseband processor with RSSI selection logic according to one embodiment of the invention;

DETAILED DESCRIPTION OF THE DRAWINGS

Figure 1:
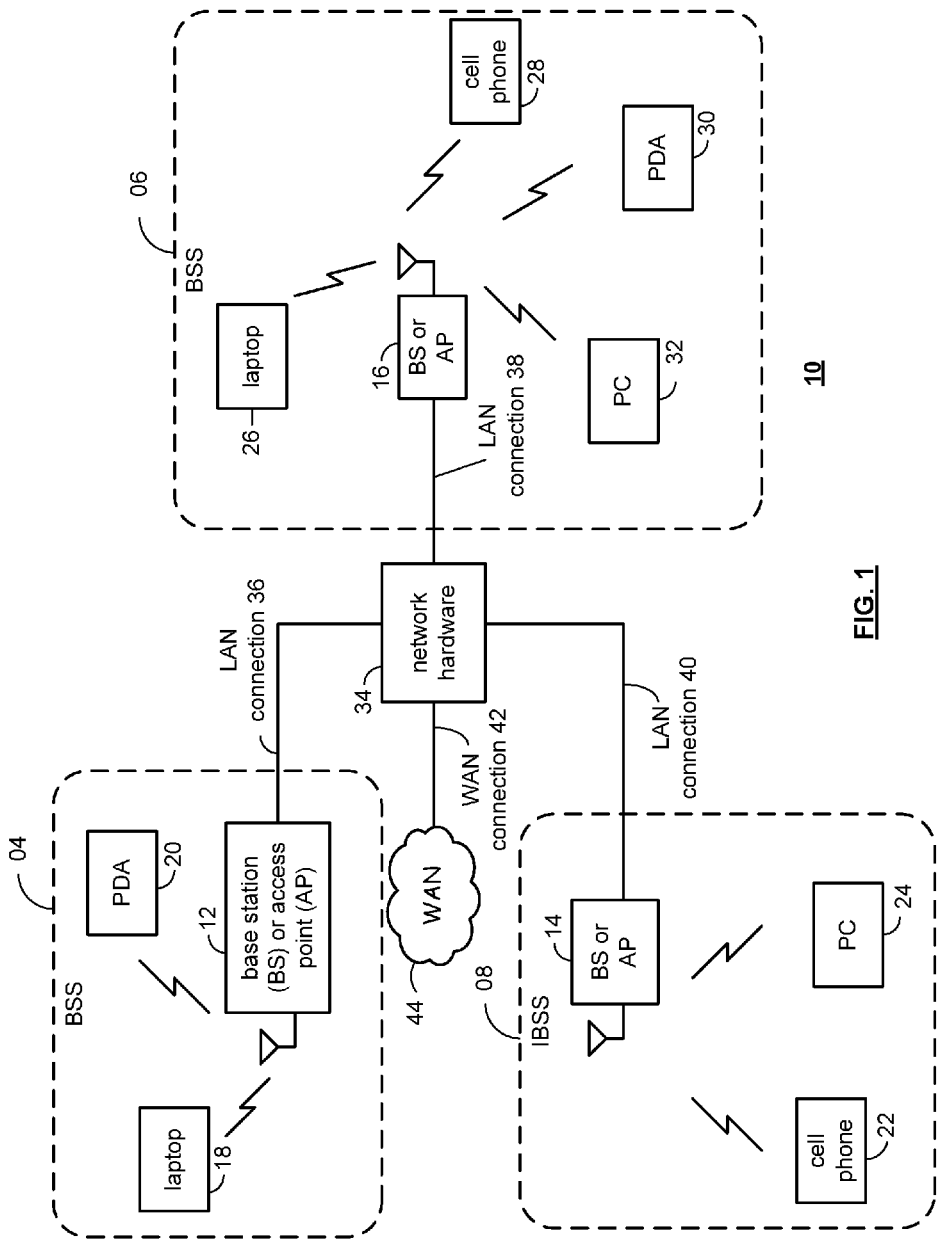
FIG. 1 is a functional block diagram illustrating a communication system that includes circuit devices and network elements and operation thereof according to one embodiment of the invention.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
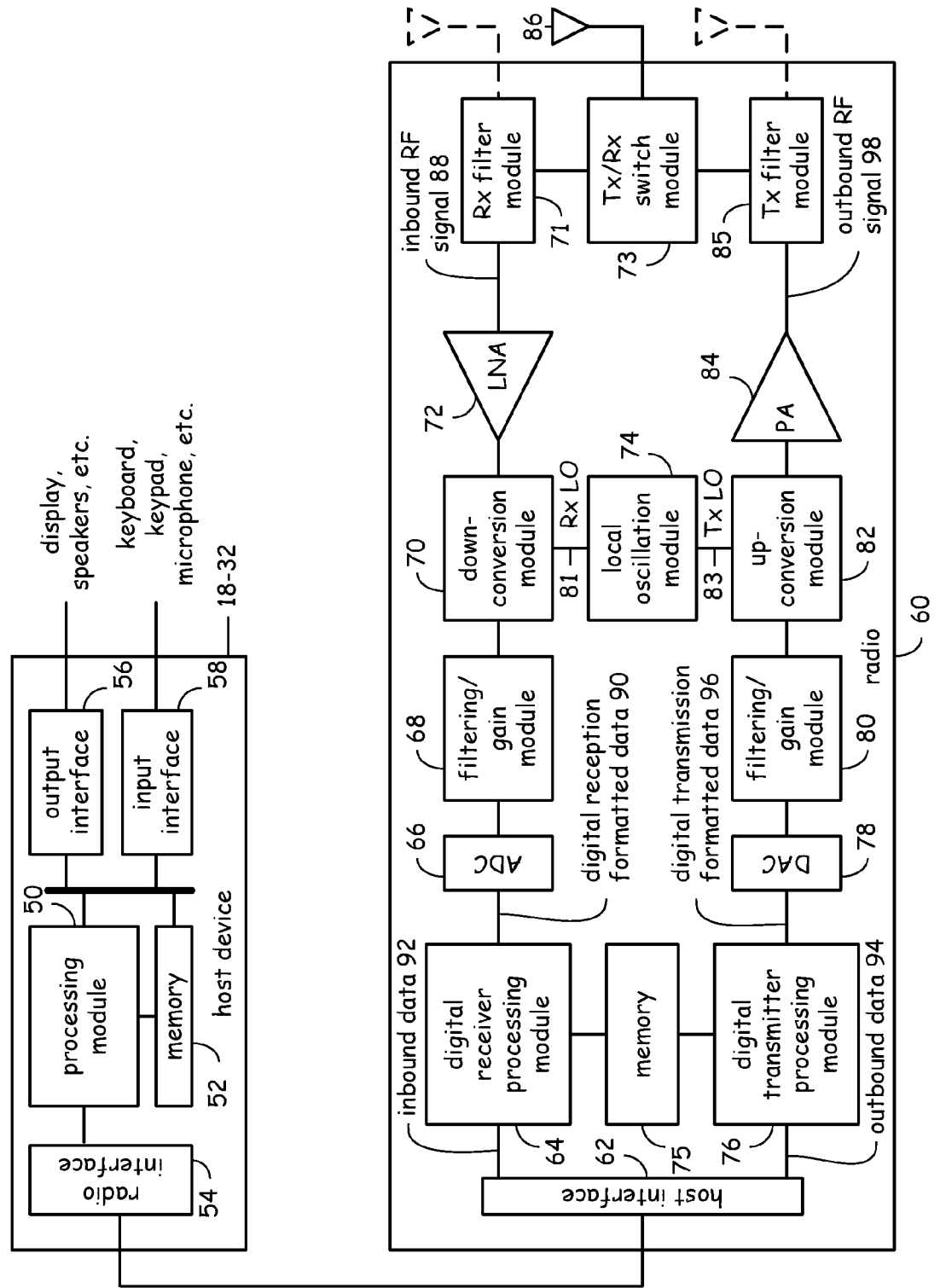
FIG. 2 is a schematic block diagram illustrating a wireless communication host device and an associated radio.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current minor devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
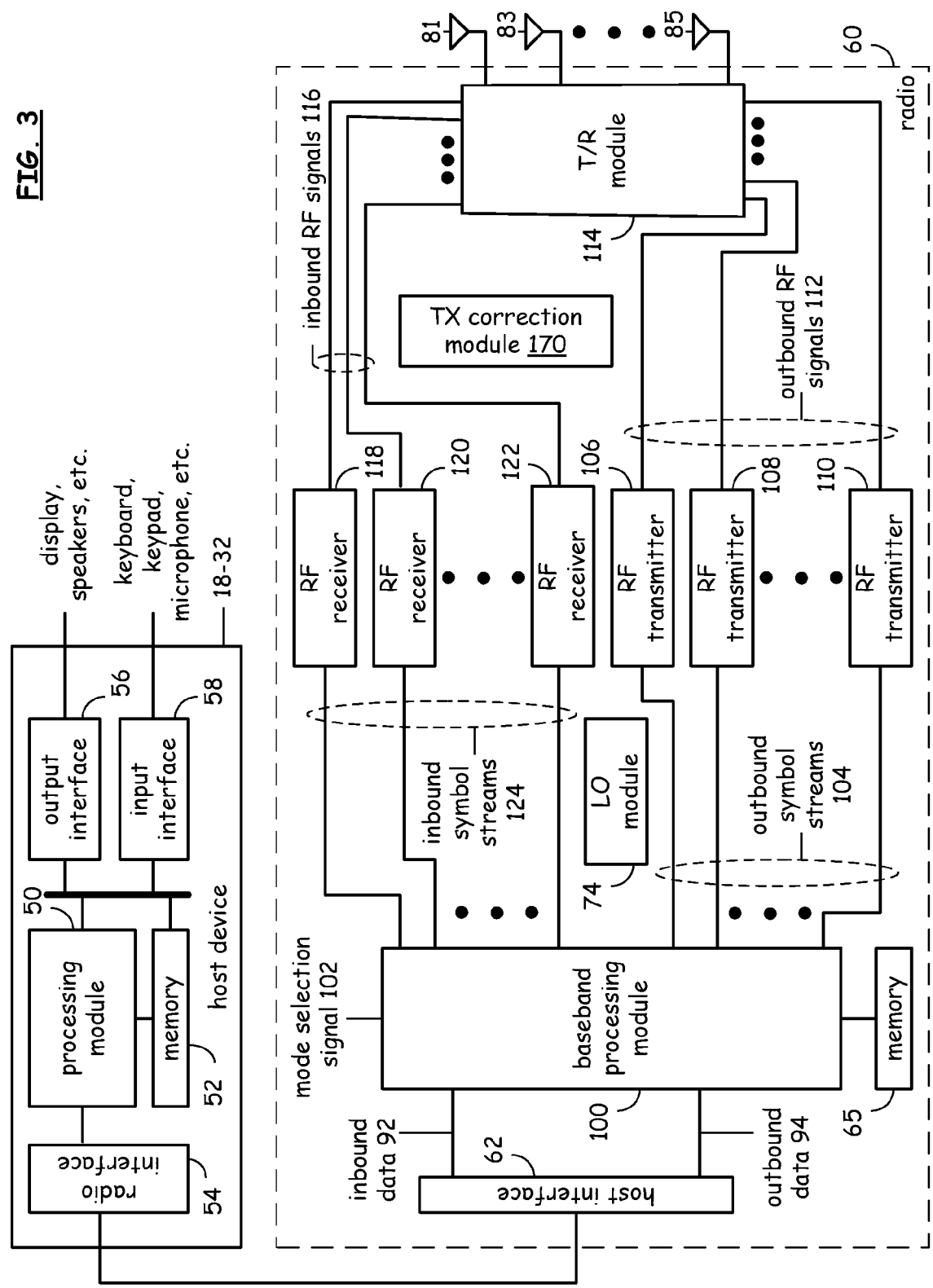
FIG. 3 is a schematic block diagram illustrating a wireless communication device that includes a host device and an associated radio.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
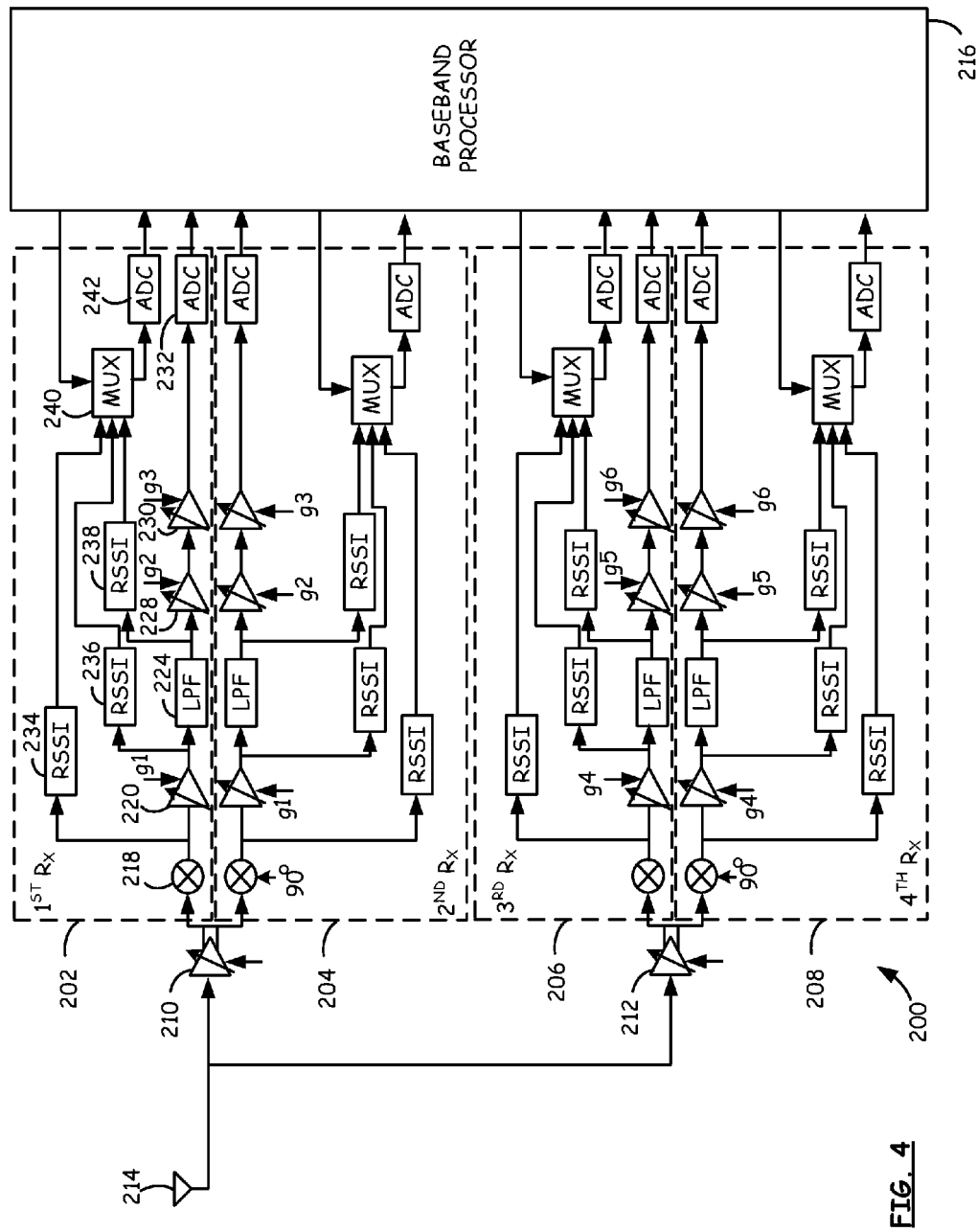
FIG. 4 is a functional block diagram of an integrated circuit radio receiver portion of a radio transceiver, and more specifically, of a receiver front end for receiving ingoing RF signals according to one embodiment of the present invention.

FIG. 4 is a functional block diagram of an integrated circuit radio receiver portion of a radio transceiver, and more specifically, of a receiver front end for receiving ingoing RF signals according to one embodiment of the present invention. A receiver front end 200 includes four receive processing blocks 202, 204, 206 and 208. More specifically, a first receive processing block 202 is for processing in-phase receive signals, while a second processing block 204 is for processing quadrature phase receive signals. Both processing blocks 202 and 204 are operable to receive and process ingoing signals received at a first receive frequency. For example, the first receive frequency is equal to 2.4 gigahertz in one embodiment of the invention. A third receive processing block 206 is operable to receive and process in-phase receive signals received at a second receive frequency, while a fourth receive processing block 208 is for processing quadrature phase receive signals also received at the second receive frequency. For exemplary purposes, the second frequency is equal to 5.0 gigahertz in one embodiment of the invention.

It should be understood that portions of the four receive processing blocks may be combined. For example, in one embodiment of the invention, the portions of the receive processing blocks 202 and 206 (in-phase signal paths for the 802.11(a) and 802.11(g) radios in the described embodiment) downstream of the mixers may be combined for embodiments in which 802.11(a) and 802.11(g) communications will not occur at the same time. Similarly, receive processing blocks 204 and 208 may be combined to achieve similar efficiency for quadrature phase signal processing. In one embodiment in which simultaneous communications over 802.11(a) in a 5 GHz channel and 802.11(b) or 802.11(g) in a 2.4 GHz channel are not expected to occur, such components may be combined to save IC real estate. In an alternate embodiment, however, such components are not combined to enable simultaneous communications in 2.4 and 5.0 GHz frequency bands in accordance with corresponding communication standards.

Each of the processing blocks 202-208 are operably coupled to receive an amplified ingoing RF signal from a corresponding low noise amplifier that in turn is operably coupled to an antenna. In the example of FIG. 4, first and second processing blocks 202 and 204, respectively, are operably coupled to low noise amplifier 210. Similarly, the third and fourth processing blocks 206 and 208, respectively, are operably coupled to low noise amplifier 212. Each of the low noise amplifiers 210 and 212 are operably coupled to receive ingoing RF signals from one or more antennas simply shown as antenna 214 in FIG. 4. As may further be seen, each of the processing blocks 202-208 are operably coupled to produce a corresponding digital ingoing signal to baseband processor 216.

While FIG. 4 illustrates a single ended radio receiver circuit, it is understood that the circuit may be implemented in a differential configuration. One preferred embodiment of the invention includes a differential radio receiver whose operation is adequately described here as a single ended circuit for simplicity. One of average skill in the art may readily expand the present teachings to a differential configuration.

Continuing to refer to FIG. 4, each of the four processing blocks 202-208 includes substantially similar circuitry that is operable to process an ingoing signal to produce a corresponding digital ingoing signal to the baseband processor 216. Each of the four processing blocks 202-208 are further operable to produce a received signal strength indication from a node that is selected from a plurality of nodes that are disposed in the corresponding ingoing circuit path. Specifically, examining the first frequency in-phase receive processing block 202, a mixer 218 is coupled to receive the amplified output from low noise amplifier 210. Mixer 218 is further coupled to receive an oscillation (not shown for simplicity) to down convert the amplified output received from the low noise amplifier from RF to an intermediate frequency or baseband frequency signal. The down-converted signal is then produced to a variable gain amplifier 220. Variable gain amplifier 220 is further coupled to receive a gain setting g1 that is generated by baseband processor 216 and produces an amplified output based upon the gain setting g1. Variable gain amplifier 220 then produces a first amplified output that is conducted through a first node to a low pass filter 224.

Low pass filter 224 produces a filtered output that is conducted through a second node to a variable gain amplifier 228. Variable gain amplifier 228 is further coupled to receive a second gain setting g2 that is generated by baseband processor 216. The variable gain amplifier 228 produces a second amplified output based upon the filtered output and further based upon the gain setting g2 to a third variable gain amplifier 230. Third variable gain amplifier 230 is further coupled to receive a third gain setting g3 from baseband processor 216. Third variable gain amplifier 230 then produces a third amplified output based upon the gain setting g3 and further based upon the second amplified output to an analog-to-digital converter 232. Analog-to-digital converter 232 then produces a digital ingoing signal to baseband processor 216.

Continuing to examine FIG. 4, first processing block 202 includes a first received signal strength indicator block 234, a second received signal strength indicator block 236, and a third received signal strength indicator block 238. Each of the received signal strength indicator blocks may also be referenced herein as an RSSI or as an RSSI block. Each of the RSSI blocks 234-238 is operably coupled to receive an ingoing signal from one of a first, a second or a third node, respectively, that is disposed within the received signal path of the first processing block 202. In the example shown, RSSI 234 is coupled to receive the ingoing signal from a node between the output of mixer 218 and the input of variable gain amplifier 220. Similarly, RSSI block 236 is operatively coupled to receive the output of first variable gain amplifier 220 from a node disposed between the output of the first variable gain amplifier 220 and the input of low pass filter 224. Each of the input signals received by RSSIs 234 and 236 are wideband signals. The third RSSI block 238 is operably coupled to receive the ingoing signal from a node disposed between the output of low pass filter 224 and the input of the second high pass variable gain amplifier 228. The ingoing signal received by RSSI block 238 is a narrow band signal.

Each of the RSSI blocks 234-238 produces a received signal strength indication to a switching device 240 that is operably controlled by the baseband processor 216. Baseband processor 216 generates an RSSI select signal to switching device 240. In the described embodiment of the invention, switching device 240 is a multiplexer (also referenced herein as a mux) that is operably coupled to receive each of the received signal strength indication outputs of RSSI blocks 234-238. As one in the art can readily appreciate, the multiplexers used in the various embodiments described herein to select an RSSI from and RSSI block are actually coupled to operate as demultiplexers since a plurality of inputs are produced to one output. Nonetheless, they are referenced herein as multiplexers since that is a common name for such a switching element. Other known switching elements or systems that allow for selection from a plurality of inputs to produce a selected output may also be used. Switching device 240 then produces a single received signal strength indication based upon the RSSI select signal received from baseband processor 216. As shown, the single received signal strength indication, in the embodiment of FIG. 4, is produced to an analog-to-digital converter 242 that converts the received signal strength indication to a digital received signal strength indication.

The structure and operation of the remaining three receive processing blocks 204-208 are substantially similar in structure to processing block 202. The second receive processing block 204 is substantially similar to first receive processing block 202 except that the mixer is operably coupled to receive an oscillation signal that is phase shifted by 90 degrees relative to the oscillation signal received by mixer 218 of receive processing block 202. Receive processing block 206 and receive processing block 208 are also similar but are operably coupled to receive an oscillation and a phase shifted oscillation for down converting a received RF signal of a different frequency. For example, in one embodiment, first and second receive processing blocks 202 and 204, respectively, receive an oscillation for down converting an RF signal that is approximately equal to 2.4 gigahertz, while third and fourth receive processing blocks 206 and 208, respectively, are operably coupled to receive an oscillation for down converting an RF signal that is approximately equal to 5.0 gigahertz. As such, for example, first and second receive processing blocks 202 and 204, respectively, may operate to receive and process ingoing RF signals according to either 802.11(b) or 802.11(g) or Bluetooth protocols/standards in the described embodiment. Third and fourth receive processing blocks 206 and 208, respectively, may operate to receive RF signals according to the 802.11(a) standard.

Because the receiver front end of FIG. 4 includes in-phase and quadrature phase receive path processing blocks for at least two received RF frequency bands, a total of 12 RSSI blocks are required if each receive path is to produce one of three received signal strength indications in the described embodiment. Baseband processor 216, therefore, is operable to control gain level settings of 12 variable gain amplifiers based upon one or more of the signal path received signal strength indications in the described embodiment of the invention. While the described embodiment of FIG. 4 shows three RSSI blocks connected as shown, it should be understood that a different number of RSSI blocks may be used and that the RSSI blocks may be operatively coupled to produce received signal strength indications from other nodes disposed within the ingoing signal path of the receiver front end. To avoid substantially duplicative explanations, the connectivity of the remaining three receive path processing blocks will not be described. Generally, though, the frequency of operation for the received RF is a function of the oscillation. For the given oscillation, in-phase or quadrature phase operation is merely a function of the relative phase of the oscillation. One of average skill in the art may readily expand the discussion of first receive path processing block 202 to appreciate the operation of the remaining receive path processing blocks 204-208.

FIG. 5 is a functional block diagram that illustrates the received signal strength indicator blocks according to one embodiment of the invention. For exemplary purposes, RSSI blocks 234, 236 and 238 of the first receive path processing block 202 of FIG. 4 are shown and described here in FIG. 5. First RSSI block 234, second RSSI block 236 and third RSSI block 236 are each operatively coupled to produce a received signal strength indication to a switching device 240 as also shown in relation to FIG. 4. First and second RSSI blocks 234 and 236, respectively, comprise an absolute value block 300, a low pass filter block 302, a buffer 304 and an amplifier 306, all coupled sequentially in series. Absolute value block 300 may be implemented with any known circuit for performing an absolute value function. In one embodiment of the invention, a source follower circuit, as is known by those of average skill in the art, is implemented to produce an absolute value (rectified) signal for a receive ingoing signal. The absolute value of the ingoing signal is then produced to low pass filter block 302 that produces a filtered absolute value to smooth out the value of the ingoing signal peak value and to generally produce a slower changing or averaging value of the ingoing signal. Low pass filter block 302 produces the filtered absolute value to buffer 304 that produces a buffered and filtered absolute value of the ingoing signal to amplifier 306. Amplifier 306, in the described embodiment, produces adequate amplification to amplify an ingoing signal to a magnitude of −10 dB for the buffered and filtered absolute value. The output of the amplifier 306, then, is the received signal strength indication in an analog form.

Each of the RSSI blocks 234 and 236 receives a wideband signal. Accordingly, the output to switching device 240 is a wideband received signal strength indication. RSSI block 238, however, is coupled to receive a narrowband signal (since the ingoing signal is being received from a node disposed downstream (after) the low pass filter of the ingoing signal path of the receive path block). Accordingly, neither the absolute value block 300, low pass filter block 302 nor buffer 304 are required. Thus, only amplifier 306 is included. The output, therefore, is a narrowband received signal strength indication.

In the described embodiments of the invention, the amplifiers 306 provide gain up to −10 dB. Further, the absolute value blocks 300 of RSSI blocks 234 and 236 are operable to detect an ingoing signal magnitude from a corresponding node disposed in the ingoing receive signal path. In the described embodiments of the invention, the nodes from which the absolute value blocks 300 receive the ingoing signal are wideband signals (out of band noise as well as in-band signal) and are disposed upstream from the low path filter about both input and output sides of at least one high pass variable gain amplifier that is disposed in the signal path to provide wideband amplification. Additionally, in the described embodiment, two RSSI blocks are formed to receive wideband signals while one RSSI block is formed to receive a narrowband signal (downstream of the low pass filter). It is understood, however, that different configurations may be employed within the scope of the teachings of the present specification and present invention.

Moreover, it should be further clarified that the circuit of FIG. 5 illustrates but one of the four receive signal path blocks illustrated in FIG. 4. Thus, the circuit of FIG. 5 is used for each of the four receive signal path blocks in one embodiment of the invention. In an alternate embodiment, circuits or circuit portions may be used for receive circuit paths that are not required to operate simultaneously, in addition to switching circuitry to facilitate the use of the circuit of FIG. 5 for a plurality of ingoing signal path blocks. Finally, the switching block of FIG. 5 is a multiplexer (mux) that is operably coupled to receive the RSSI select signal from the baseband processor (or other processor or logic) in one embodiment. Technically speaking, the multiplexer is being used as a multiplexer since many inputs may operably be coupled to one output. In general terms, however, such a device may be referred to herein as a multiplexer or mux. Other known switching/routing mechanisms may also be utilized.

FIG. 6 is a functional block diagram of a received signal path with a plurality of RSSI blocks for providing select RSSI block signal strength indications according to one embodiment of the invention. As may be seen, the receive signal path of FIG. 6 is similar to that of FIG. 4 and therefore contains many of the same reference numbers. Operation here is the same as FIG. 4 for commonly numbered elements. In addition to the RSSI blocks 234-238 and switching device 240, FIG. 6 includes a driver 350 that improves signal characteristics (power, loading, etc.) and an RSSI ADC 352 disposed in series therewith. RSSI ADC 352 is operable to receive an analog RSSI indication and to produce a corresponding digital RSSI value to baseband processor 216. In one embodiment of the invention, baseband processor 216 determines clipping is occurring in the receive signal path by determining that clipping is occurring at RSSI ADC 352. In another embodiment, baseband processor 216 determines that clipping is occurring at the signal path ADC 232 if a digital value of a signal strength indication received from RSSI ADC 352 exceeds a specified threshold. In yet another embodiment, baseband processor 216 merely evaluates an output of signal path ADC 232 to determine whether clipping is occurring and determines a maximum amount of gain that eliminates clipping by setting gain levels of amplification devices to unity (in any one of a specified number of orders) until clipping at the signal path ADC no longer occurs.

In comparing the topology of the wideband RSSI blocks 234 and 236 to the downstream signal paths relative to the sample point as shown in FIG. 5, it may be seen that the wideband RSSI blocks and the downstream signal paths both include low pass filters and amplifiers. As such, the baseband processor is able to gauge the signal magnitude of the wideband signal by providing similar circuitry and is, more specifically, able to determine whether total amplification is resulting in clipping at the signal path ADC. As such, the baseband processor is able to determine a maximum total amount of gain that is allowable while avoiding clipping at the signal path ADC 232.

FIG. 7 is a functional block diagram illustrating a baseband processor 216 with RSSI selection logic according to one embodiment of the invention. Specifically, baseband processor 216 includes RSSI selection logic 354 that generates RSSI selection signals A, B and C for selecting an RSSI block whose signal strength indication is to be selectively produced to the baseband processor 216. As will be described in greater detail below, baseband processor 216 selects each of the RSSI blocks in a sequential manner to determine a maximum amount of allowable gain in the signal path and to determine whether to apply the majority of the gain in a front end or a back end of the signal path or to evenly apply the gain throughout the signal path in one embodiment of the invention.

Figure 8:
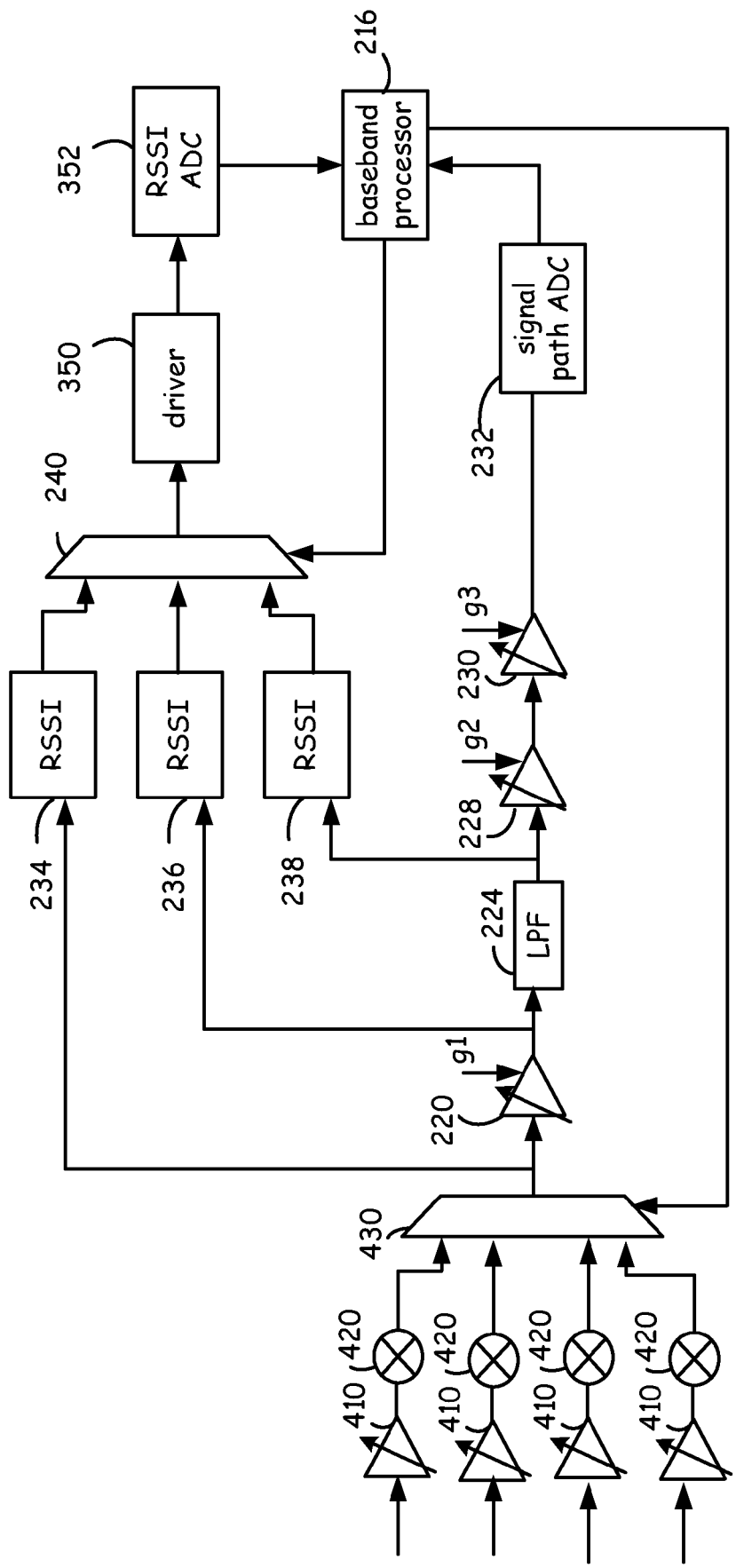
FIG. 8 is a functional block diagram of an integrated circuit radio transceiver in which common components of a receive signal path are shared between a plurality of receive signal paths according to an alternate embodiment of the invention.

FIG. 8 is a functional block diagram of an integrated circuit radio transceiver in which common components of a receive signal path are shared between a plurality of receive signal paths according to an alternate embodiment of the invention. Elements described in relation to the previously described figures are given the same reference numbers as before. Operation and structure is as discussed above for the commonly numbered elements. Comparing FIG. 8 to FIGS. 4 and 6, the elements downstream of the signal mixers are shared. To facilitate such sharing, a switching element is utilized to select a mixer output that is to be operatively coupled to the commonly shared receive signal path components. Thus, for example, a plurality of low noise amplifiers 410 are each coupled to a corresponding plurality of mixers 420 that perform in-phase and quadrature phase mixing to down-convert an ingoing signal to baseband (or IF) for two ingoing RF signal frequency bands. The down-converted output of each of the mixers 420 are then produced to a switch 430 which operatively couples a selected mixer output to the receive signal path and, more particularly, to an input of high pass variable gain amplifier 220. The operation of variable gain amplifier 220 and the other components downstream of switch 430 are as described above. As may be further seen, baseband processor 216 generates a control signal that is produced to switch 430 to select a mixer output of the four mixers 420. In this embodiment, the baseband processor is operable to generate four mixer select signals and three RSSI select signals to potentially receive twelve signal strength indications from only three RSSI blocks by generating select signals for every switching combination allowed by switching devices 430 and 240.

Figure 9:
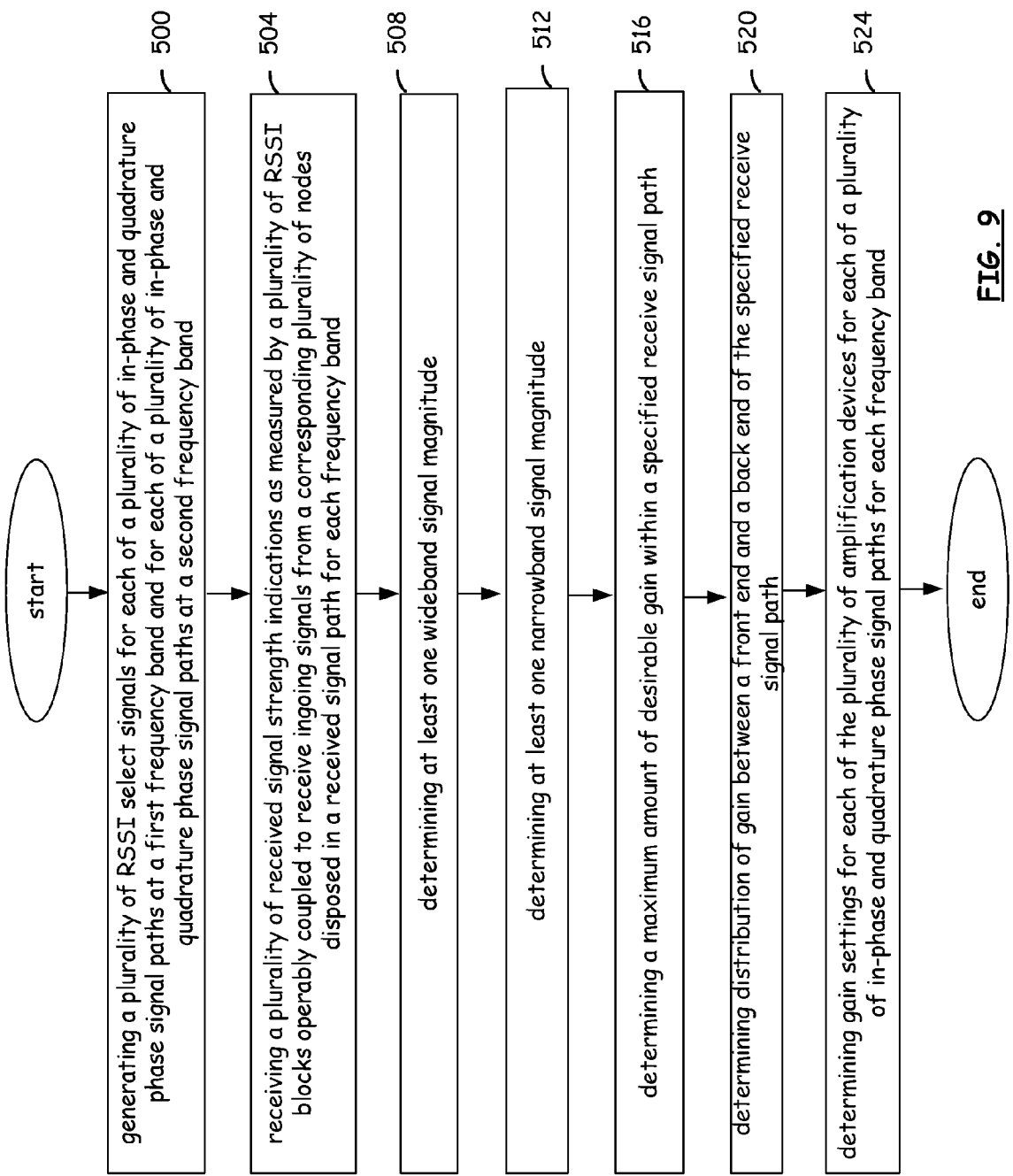
FIG. 9 is a flow chart illustrating a method for setting gain levels for a plurality of amplification devices within an integrated circuit radio transceiver according to one embodiment of the invention.

FIG. 9 is a flow chart illustrating a method for setting gain levels for a plurality of amplification devices within an integrated circuit radio transceiver according to one embodiment of the invention. Initially, a baseband processor generates a plurality of RSSI select signals for each of a plurality of in-phase and quadrature phase signal paths at a first frequency band and for each of a plurality of in-phase and quadrature phase signal paths at a second frequency band (step 500). In a radio configuration in which a plurality of radio front ends are provided to support operation at a plurality of frequency bands, a baseband processor is operable to set gain level settings for amplifiers within each receive path based upon received narrowband and wideband signal strength. To determine the proper gain level settings, however, the baseband processor selects each RSSI block within the signal paths to determine the received signal strength as measured by the corresponding RSSI block. Thus, the baseband processor individually selects each RSSI block in a sequential manner to receive a corresponding signal strength indication.

Thereafter, the baseband processor receives a plurality of received signal strength indications as measured by a plurality of RSSI blocks operably coupled to receive ingoing signals from a corresponding plurality of nodes disposed in a received signal path for each of a plurality of in-phase and quadrature phase signal paths at the first frequency band and for each of a plurality of in-phase and quadrature phase signal paths at the second frequency band (step 504).

As a part of the described process, the baseband processor determines at least one wideband signal magnitude (step 508) and further determines at least one narrowband signal magnitude (step 512). These determinations are made from received signal strength indications from different RSSI blocks (in the described invention) that are operably coupled to nodes that are disposed upstream and downstream of a low pass filter, respectively. As a part of evaluating the wideband and narrowband signal magnitudes (at least generally, for example, it is within a specified threshold), the baseband processor determines whether clipping is a result of amplification by each of the amplification blocks, devices, or circuits for which a downstream received signal strength indication is measured. Thus, by evaluating an output of each amplification block, device or circuit, the baseband processor is able to determine an amount of gain that did not result in clipping from over amplification and an amount of amplification that did result in clipping of the received ingoing signal. Thus, the baseband processor is operable to determine a maximum amount of desirable gain within a specified receive signal path (step 516) and to further determine distribution of gain between a front end and a back end of the specified receive signal path (step 520).

After determining wideband and narrowband signal magnitudes, the maximum amount of gain, and distribution of gain between the front end and back end of a receive signal path, the baseband processor is operable to determine gain settings for each of the plurality of amplification devices for each of a plurality of in-phase and quadrature phase signal paths at the first frequency band and for each of a plurality of in-phase and quadrature phase signal paths at the second frequency band (step 524).

Figure 10:
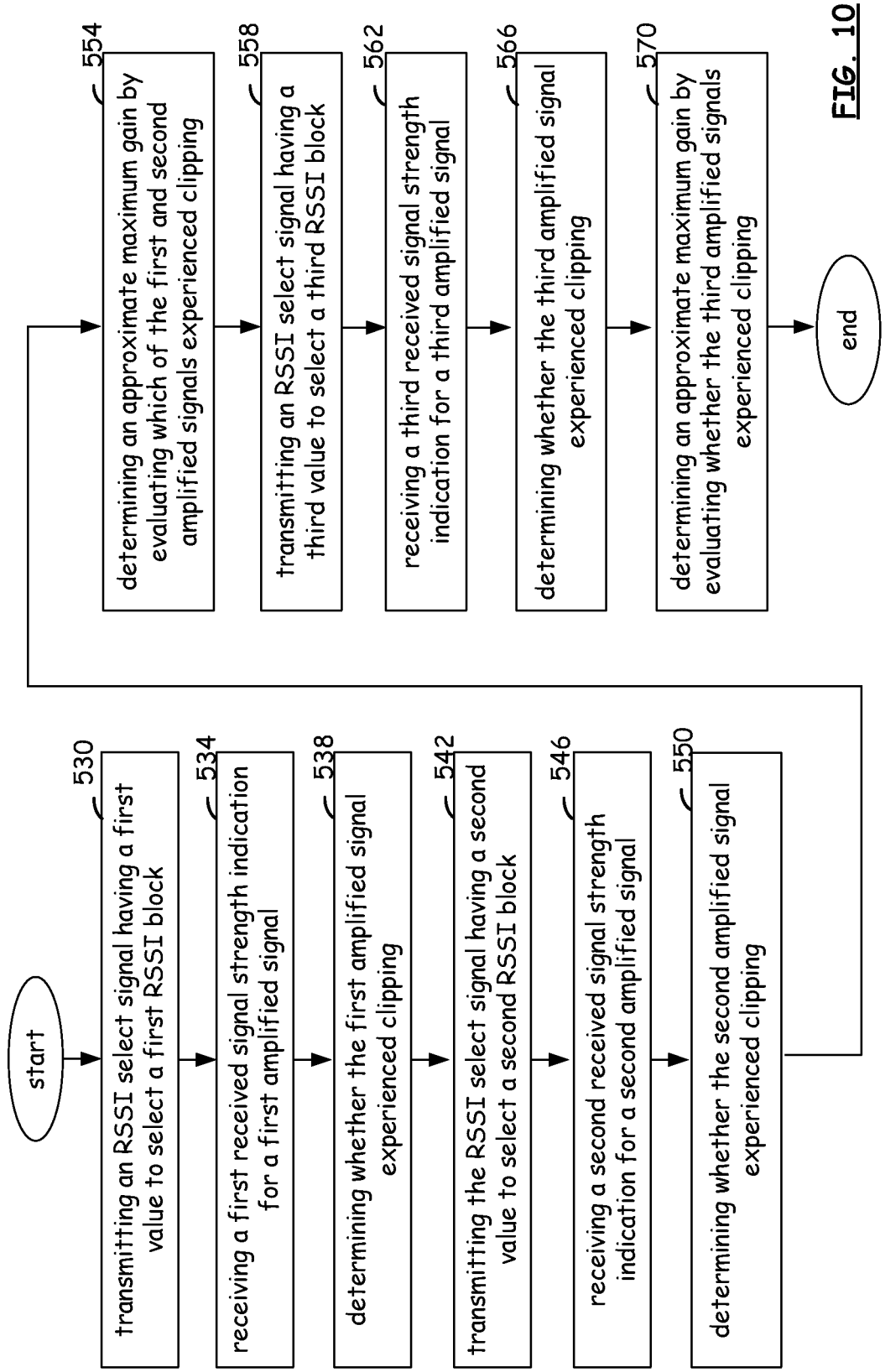
FIG. 10 is a flow chart illustrating a method for obtaining received signal strength indications from a plurality of RSSI blocks according to one embodiment of the invention.

FIG. 10 is a flow chart illustrating a method for obtaining received signal strength indications from a plurality of RSSI blocks according to one embodiment of the invention. Referring to FIG. 10, the described method includes transmitting an RSSI select signal having a first value to select a first RSSI block (step 530), receiving a first received signal strength indication for a first amplified signal (step 534) and determining whether the first amplified signal experienced clipping (step 538). Thereafter, the method according to the described embodiment further includes transmitting the RSSI select signal having a second value to select a second RSSI block (step 542), receiving a second received signal strength indication for a second amplified signal (step 546), and determining whether the second amplified signal experienced clipping (step 550). Thereafter, the method includes determining an approximate maximum gain by evaluating which of the first and second amplified signals experienced clipping (step 554).

In an embodiment of the invention that includes a third RSSI block, the method according to the described embodiment includes transmitting an RSSI select signal having a third value to select a third RSSI block (step 558) and receiving a third received signal strength indication for a third amplified signal (step 562). The method further includes determining whether the third amplified signal experienced clipping (step 566) and determining an approximate maximum gain by also evaluating whether the third amplified signals experienced clipping (step 570).

In the above described embodiment, referring back to FIG. 6, for exemplary purposes, the first RSSI block is the narrowband RSSI block 238, while the second and third RSSI blocks are wideband RSSI blocks 236 and 234, respectively. Thus, the baseband processor is operable to determine if the total gain provided by amplification devices in the receive path results in clipping and, if so, determine which amplification devices are providing the additional amplification that results in clipping. While the described embodiments illustrate just three RSSI blocks, it should be understood that more or less may be used. For example, additional RSSI blocks may be used to determine signal magnitude at nodes disposed after any one of high pass variable gain amplifiers 228 or 230 or low noise amplifier 210, each of which is operable to set gain levels according to a gain level setting received from the baseband processor.

Figure 11:
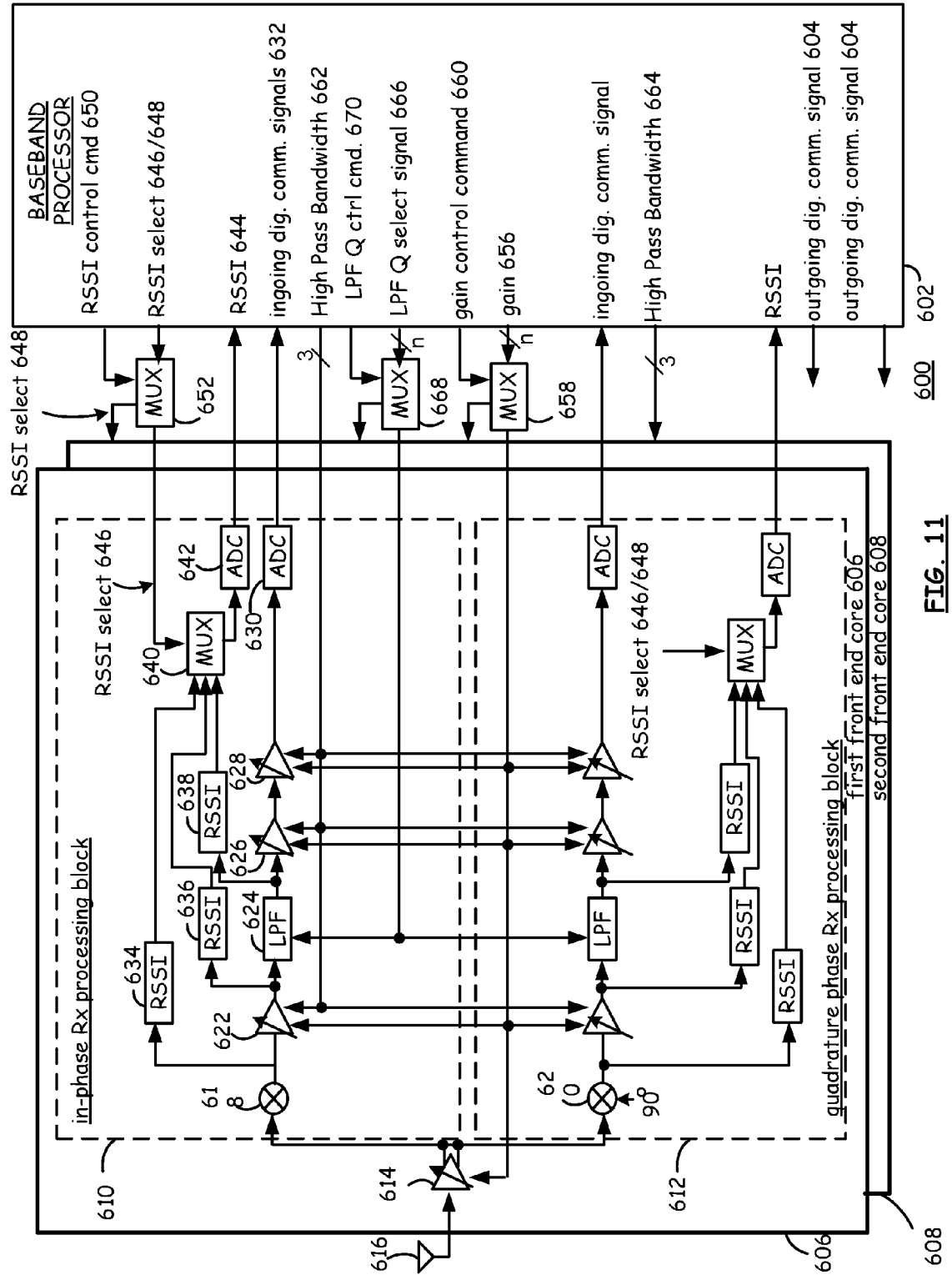
FIG. 11 is a functional schematic diagram of a radio transceiver according to one embodiment of the invention.

FIG. 11 is a functional schematic diagram of a radio transceiver according to one embodiment of the invention. A radio transceiver 600 includes a baseband processor 602 that is operable to receive ingoing digital communication signals from a receive path and to produce outgoing digital communication signals to a transmit path wherein the receive path and transmit path are both formed within a radio front end. Outgoing signals, shown here as outgoing digital communication signals 604, are produced front end transmitter circuitry (not shown) of one or more front end cores in an embodiment that includes a transmitter and a receiver. In the embodiment shown of FIG. 11, radio transceiver 600 includes first and second cores that each include receive path circuitry for a radio front end. The transmitter circuitry may be formed within the first and second cores or may be formed separately.

Generally, baseband processor 602 is operable to communicate with one or more radio front ends to transmit and receive wireless communication signals. In the described embodiment of the invention, baseband processor 602 is operable to communicate with a plurality of front end cores that each include receive path and transmit path circuitry. In the example shown of FIG. 11, baseband processor 602 is operable to communicate with a first front end core 606 and with a second front end core 608. It should be understood that cores 606 and 608 are substantially similar in topology and facilitate a wireless transceiver communicating over a plurality of different frequency bands.

Generally, FIG. 11 illustrates a radio transceiver having a baseband processor 602 that is operable to transmit outgoing communication signals 604 and to receive ingoing digital communication signals 632 from first and second front end cores 606 and 608. First and second front end cores 606 and 608 each include an in-phase Rx processing block 610 and a quadrature phase Rx processing block 612. Both the in-phase Rx processing block 610 and quadrature phase Rx processing block 612 are operably coupled to a low noise amplifier 614 that, in turn, is coupled to an antenna 616. Low noise amplifier 614 receives an RF signal detected from antenna 616 and produces an amplified RF signal to a pair of mixers (e.g., Gilbert Cell Mixers) that down-convert the received RF to one of an intermediate frequency or baseband frequency signal. In the described embodiment of the invention, mixers 618 and 620 down-convert the amplified RF produced by low noise amplifier 614 to a baseband frequency signal.

Because a local oscillation used by mixer 620 is offset by 90 degrees relative to mixer 618, processing blocks 610 and 612 are operable to process the in-phase and quadrature phase components of the down-converted signals produced by the corresponding mixers 618 and 620. With the exception of the operation of the mixers as described, the remaining operation of the in-phase Rx processing block 610 and the quadrature phase Rx processing block 612 is substantially similar. As such, only the operation of in-phase Rx processing block 610 will be thoroughly described in the remainder of the discussion of FIG. 11.

Generally, it may be seen that an output of mixer 618 is produced to a high pass variable gain amplifier 622 that high pass filters and amplifies the baseband frequency signals received from mixer 618 to produce a wideband signal to a low pass filter 624. Low pass filter 624 then filters the wideband signal to produce a narrow band signal to a high pass filter variable gain amplifier 626. The output of high pass variable gain amplifier 626 is then produced to a second high pass variable gain amplifier 628. An amplified and high pass filtered narrowband signal is then produced from high pass variable gain amplifier 628 to an analog-to-digital converter 630. Analog-to-digital converter 630 produces the ingoing digital communication signals 632 to baseband processor 602.

Typically, an ADC such as ADC 630 can only accept a signal within a specified signal magnitude range in order to properly convert the signal from analog to digital form. If the signal magnitude is too low, the ADC cannot properly detect it. If the signal magnitude is too high, clipping occurs and inaccurate signal values resulting from quantization errors are produced as digital signals. Rx processing block 610 is therefore operable to maintain the signal magnitude seen by ADC 630 within a specified range based upon one or more control commands received by various circuit blocks of Rx processing block 610.

Disposed between the various elements described here in the receive path of in-phase Rx processing block 610 (namely, mixer 618, HP-VGAs 622, 626 and 628, and LPF 624 are a plurality of nodes used as sample points for a plurality of received signal strength indicator blocks. For example, a first received signal strength indicator (RSSI) block 634 is operably coupled to sample a wideband signal at a baseband frequency produced by mixer 618. A second RSSI block 636 is operably coupled to sample a signal strength of a high-pass filtered and amplified wideband signal at a sample node disposed between high pass variable gain amplifier 622 and low pass filter 624. A third RSSI block 638 is operably coupled to sample a received signal strength indication from a sample node disposed between low pass filter 624 and high pass variable gain amplifier 626.

The signal sampled by RSSI's 636 and 638 are narrowband signals because they are received from a sample node disposed downstream of the low pass filter 624. Each of the outputs of RSSI blocks 634, 636 and 638, are produced to a multiplexer (or, more accurately, a de-multiplexer) 640, which, in turn, produces a selected RSSI block output to an analog-to-digital converter 642. Analog-to-digital converter block 642 produces a digital RSSI 644. As may further be seen, mux 640 is operably coupled to receive an RSSI select signal 646 that is used to select between the outputs of RSSI blocks 634, 636 and 638. As may further be seen, baseband processor 602 also generates an RSSI select signal 646/648 that is produced to second front end core 608. Whether RSSI select signal 646/648 is produced to core 606 or to core 608 depends on an RSSI control command 650 produced by baseband processor to mux 652.

Continuing to refer to FIG. 11, it may be seen that baseband processor 602 produces n-bit wide gain signal 656 for delivery to a plurality of amplification units disposed within in-phase Rx processing block 610 and quadrature phase Rx processing block 612. Specifically, however, the n-bit wide gain signal 656, hereinafter gain 656, is produced to a multiplexer 658 that selectively routes the gain signal either to first front end core 606 or second front end core 608 based upon gain destination control command 660. In one embodiment of the present invention, gain 656 is a 13-bit wide gain signal that is produced to low noise amplifier 614 of first front end core 606, as well as to high pass variable gain amplifiers 622, 626 and 628, in one embodiment of the invention by way of mux 652. Because gain 656 is muxed to the first and second front end cores 606 and 608, only one set of 13-bit wide output pins must be used from baseband processor 602.

While gain 656 is multiplexed between the first front end core 606 and the second front end core 608 based upon gain destination control command 660, a high pass bandwidth control command 662 is passed to core 606 while high pass bandwidth control command 664 is passed to core 608. In the described embodiment, the signals are three bits wide and are operable to set a gain for at least one HPVGA. A low pass filter Q select signal 666 is produced directly to a mux 668. Mux 668 is operably disposed to receive an LPF Q select control command 670 wherein LPF Q is produced to low pass filters of cores 606 or 608 depending upon a state of LPF Q control command 670. For a first state of control command 670, the LPF Q select signal 666 is produced to low pass filter 624 by way of mux 668 (as well as the LPF of processing block 612 for the quadrature phase signal processing) based upon LPF Q control command 670. In an alternate embodiment, separate dedicated lines are produced not only to the first and second front end cores 606 and 608, but also to the corresponding amplifiers within the in-phase Rx processing block 610 and the quadrature phase Rx processing block 612. In yet another alternate embodiment, the HP Bandwidth signals are produced to a mux (not shown) for selectively passing to the first and second front end cores in a manner similar to that described for the LPF Q and gain above.

Generally, FIG. 11 illustrates that some signals may be multiplexed (or switched using other known switching devices) between the first front end core 606 and the second front end core 608, while others may be coupled directly to the circuit elements that are to receive the associated control command. As a general rule, the devices whose responses are the most time critical are selected to be given dedicated lines, while the devices whose response is not as time critical are routed through a multiplexer to reduce the required dedicated pins from the baseband processor. In the case of the gain signal 656, for example, it may be seen that 13 pins are saved if a 13-bit wide signal path is multiplexed to produce gain signal 650 to the first and second front end cores 606 and 608, respectively.

As may be seen, high pass bandwidth control command 662 and low pass filter Q select signal 666 are produced to high pass variable gain amplifiers 622, 626, 628 and low pass filter 624, respectively, of in-phase Rx processing block 610. While the high pass bandwidth control command is produced directly to the HPVGAs 622, 626 and 628, the LPF Q is conducted through a mux. Similarly, high pass bandwidth control command 658 is produced to high pass variable gain amplifiers of the second core 608, while a low pass filter Q select signal 660 is produced to a low pass filter of the second core 608 through mux 668.

Figure 12:
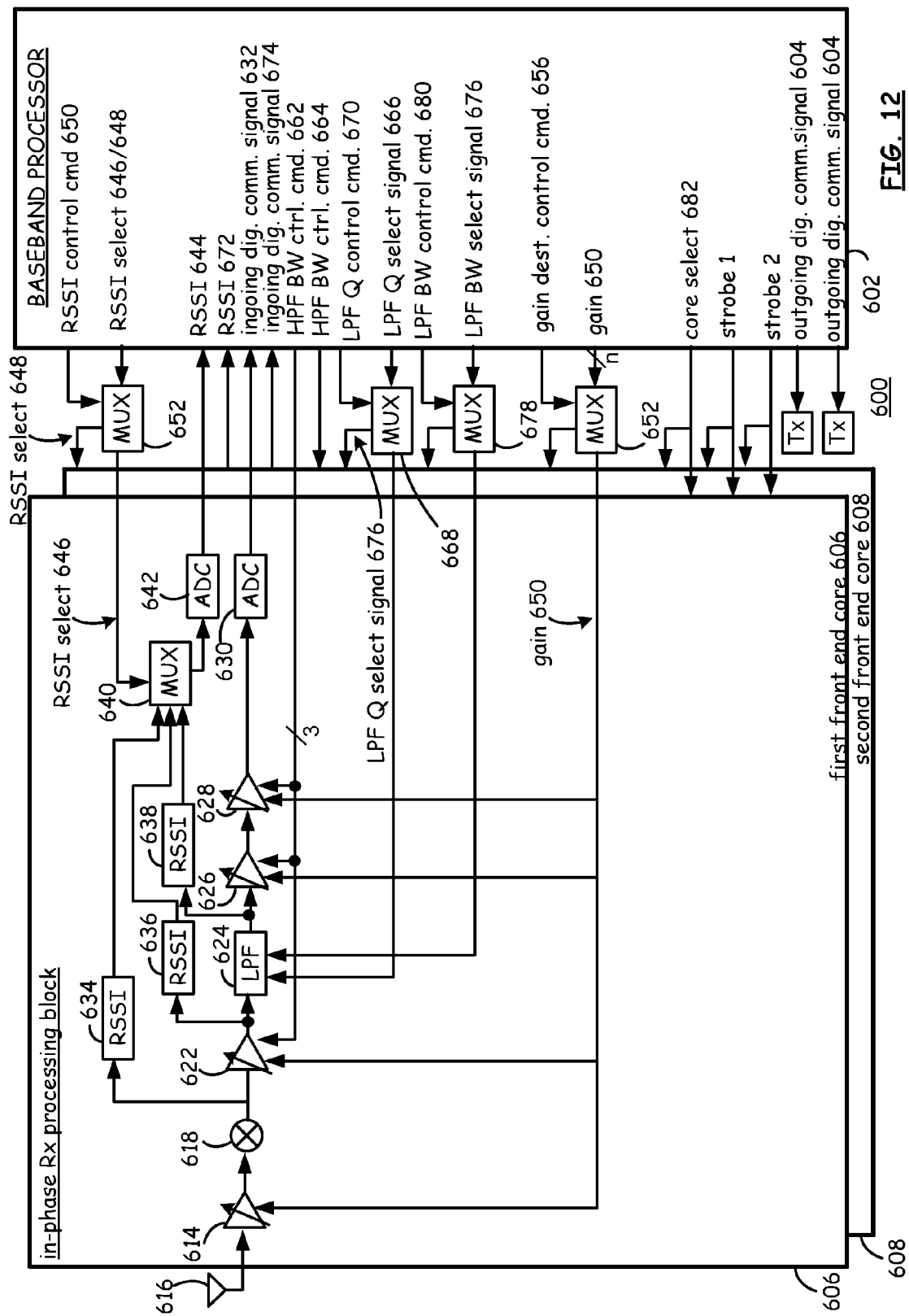
FIG. 12 is a functional schematic diagram of a transceiver according to an embodiment of the present invention.

FIG. 12 is a functional schematic diagram of a transceiver according to an embodiment of the present invention. While there are similarities between the circuit of FIG. 11 and FIG. 12, FIG. 12 illustrates in greater detail the connectivity between the baseband processor and a portion of a single front end core according to one embodiment of the present invention. The details illustrated here in FIG. 12 also apply to FIG. 11 and other embodiments of the invention. Specifically, FIG. 12 illustrates the connectivity and operation between the baseband processor and an in-phase Rx processing block in greater detail than was illustrated in FIG. 11. Similar part numbers will be used for the parts introduced in FIG. 11 that are not changed here in FIG. 12. Accordingly, the discussion of those same parts will be left to FIG. 11 and will not be repeated here.

In addition to the parts described in FIG. 11 and the circuit paths described in FIG. 11, FIG. 12 illustrates in greater detail the dedicated signals that are conducted between the first and second front end cores 606 and 608 in addition to new signals not introduced before. For example, while FIG. 11 illustrated an RSSI select signal 648 that was produced to second front end core 608, FIG. 11 did not illustrate a corresponding received signal strength indication from the second front end core 608. Accordingly, here in FIG. 12, an RSSI 672 is shown as being received from core 608 by baseband processor 602. Similarly, an ingoing digital communication signal 674 is shown as being received from the second front end core 608. Additionally, a low pass filter bandwidth select signal 676 is produced to a mux 678 that is selectively produced either to core 606 or core 608 based upon a logic state of LPF bandwidth control command 680.

Similar to the mux 658 configuration for transmitting gain 656 to the first and second front end cores 606 and 608, mux 678 is used to conduct a low pass filter bandwidth select signal 676 to one of the first and second front end cores 606 and 608, respectively. Additionally, not shown in FIG. 11 but shown here in FIG. 12, is the core select signal 682 that is produced by the baseband processor to select a core for a specified command. Specifically, a core select signal 682 is produced to both the first front end core 606 and to the second front end core 608. Accordingly, when a control command is produced by baseband processor 602, core select signal 682 is used to facilitate the correct core responding to the control command. To further facilitate the controlled latching of data or control commands produced by the baseband processor, strobe 1 or strobe 2 signals are produced by baseband processor 662 to both first front end core 606 and second front end core 608. Also, as shown in FIG. 11, outgoing digital communication signals 604 are produced to the associated transmit path of the first and second front end cores 606 and 608.

In operation, many of the features illustrated here in FIG. 12 are similar to what was shown and described in relation to FIG. 11 and will not be repeated. In general, however, it may be seen that some control commands are produced on dedicated lines or signals paths to an associated core, while others are produced to a multiplexer which are then distributed to the cores. To further facilitate the controlled delivery of data, the embodiments of the present invention include the use of a core select signal 682 and strobe signals 1 and 2 that are operable to specify which groups of circuit elements within the first and second front end cores 606 and 608 are to latch a specified data or control signal. Thus, it is the combination of the core select signal and the value of the strobe signal that determines which circuit elements or groups of circuit elements will latch a control or data line. Such a topology is particularly beneficial in a system, such as that shown here in FIG. 12, wherein a plurality of cores are coupled to a baseband processor in a manner that reduces required data pins by the baseband processor. Thus, as shown in FIG. 12, some pins are saved by multiplexing the low pass filter bandwidth select signal 680 and the gain 650. In the described embodiments, other signals, such as the low pass filter Q select signals and the high pass filter bandwidth select signals, are produced over dedicated lines or signal paths instead of multiplexed lines to reduce response time since those items are more time critical.

Generally, the high pass filter bandwidth select signals and the low pass filter Q select signals are operable to prompt the associated filter to operate in a manner that provides a faster settle time albeit at a reduced performance. In the described embodiments of the invention, the baseband processor will reduce the bandwidth of a high pass filter or the Q of a low pass filter only when there is a gain change that is produced to that device, or in the case of the low pass filter, upstream of that device, in order to facilitate a faster settle time. Subsequently, the bandwidth and Q of the high pass filter and low pass filters, respectively, are restored to the original values to provide the desired filtering. Reducing the bandwidth of the high pass filter and the Q of the low pass filter decreases operation but, advantageously, also decreases settle time.

Figure 13:
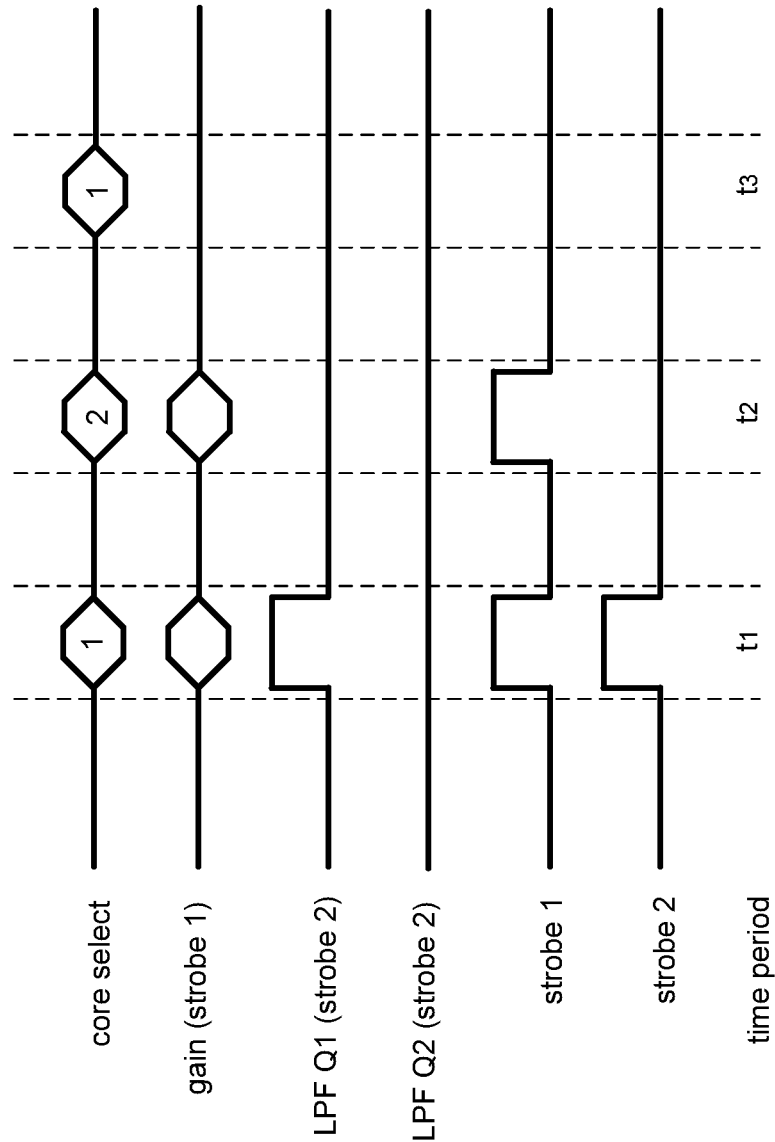
FIG. 13 is a signal timing diagram that illustrates operation according to one embodiment of the present invention.

FIG. 13 is a signal timing diagram that illustrates operation according to one embodiment of the present invention. Generally, in this described embodiment of the invention, for a gain value to be latched, a first strobe must be activated, while a second strobe must be activated if low pass filter Q select signal is to be latched. Accordingly, at a time t1, a core select signal is set to select the first core, as may be seen. Assuming that the object is to adjust the gain for the first core, a gain setting must also be produced at time t1. In the described embodiment, since gain is allocated to strobe 1, the strobe 1 signal must also be set during time t1 to facilitate the gain values being latched. Further, in the described embodiment, if a gain value for an amplifier upstream of a low pass filter is being modified, for example, the low noise amplifier or a high pass variable gain amplifier that is upstream of the low pass filter, then the low pass filter Q select signal may also be set according to the described embodiment to reduce the low pass filter settle time. However, since the low pass filter Q select signal is driven by the second strobe, the second strobe must also be activated at time period t1 to facilitate the low pass filter Q select signal being latched. Accordingly, as may be seen at time period t1, a core select signal is specified, a gain signal is specified, a low pass filter Q select signal is specified, and both the strobe 1 and strobe 2 are activated to facilitate all of the preceding values being latched by corresponding circuit elements (namely, the corresponding amplifiers and the low pass filter).

If, at a time period t2, a gain level setting is required for the second core, then the core select signal is set to 2, the gain setting is produced, and the first strobe is set. Here, because the low pass filter Q value is not being activated, one may presume that the gain was unaffected for any amplification device upstream of a low pass filter in the receive path. Generally, the gain is produced by the baseband processor to a multiplexer that is multiplexed to the first and second cores on a continual basis in one embodiment of the invention. Accordingly, the use of the core select signal, as well as the first strobe, facilitates the second core receiving and recognizing the new gain level setting.

In the described embodiment of the invention, the core select signal has one of a plurality of values, including core 1, core 2, all cores receive, all cores transmit, and all cores receive and transmit. Accordingly, the five different values illustrated here for the core select signal provide significant control as to what circuit portions of a radio transceiver will be operable to respond to a specified command.

Figure 14:
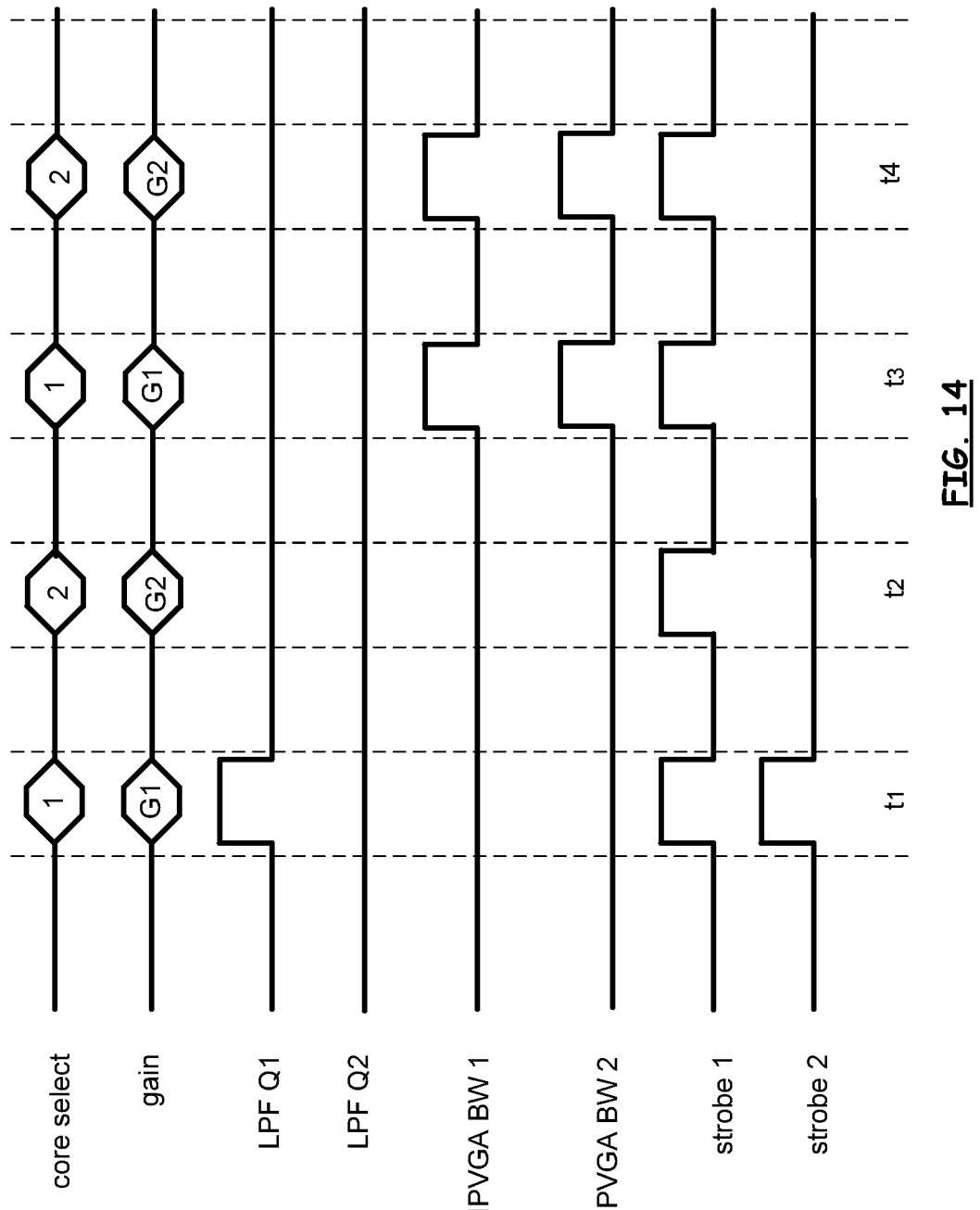
FIG. 14 is a signal timing diagram that further illustrates operation according to one embodiment of the present invention.

FIG. 14 is a signal timing diagram that further illustrates operation according to one embodiment of the present invention. As may be seen, strobe 1 is activated for each time period in which the gain signal is set, whether it is set for the first or second core. Thus, since the gain signal is set at time periods t1, t2, t3 and t4, strobe 1 is set during those same time periods to facilitate the latching of the gain signal by the amplifiers. In the described embodiment, gain 656 is a 13-bit wide signal that defines gain levels for the low noise amplifier and for first and second variable gain amplifiers. With the present scheme, the baseband processor is required to keep track of current gain settings for each of these amplifiers and to specify such gain settings each time the gain signal is produced even if a gain value for a specified amplifier is left unchanged because, upon activation of strobe 1, each of these amplifiers will latch the gain signal and reset their gain value (even if the gain value is unchanged from a previous gain value).

In the described embodiment, low pass filter Q select is set only once during time period t1 and, therefore, strobe 2 is set during time period t1 since strobe 2 is required for the latching of the low pass filter Q select signal. As may further be seen, the high pass VGA bandwidth select signals are set only during periods t3 and 4. Accordingly, strobe 1 is set during periods t4 and t5 to facilitate those high pass variable gain amplifier bandwidth select signals being properly latched. As may be seen, strobe 1 is set to latch the high pass VGA bandwidth select signals regardless of whether the signal is going to the first core or the second core. One point to recognize in the above-described operation, is that each signal associated with a strobe for a particular core must be set and produced during the activation of the corresponding strobe. Accordingly, the general observation of the embodiment of the invention is that simplifying the interface through the use of the core select signal and the plurality of strobes requires a baseband processor to perform additional bookkeeping to maintain values of the signals that relate to the specified strobes so that those signals may be reproduced on the interface upon activation of the corresponding strobe.

Figure 15:
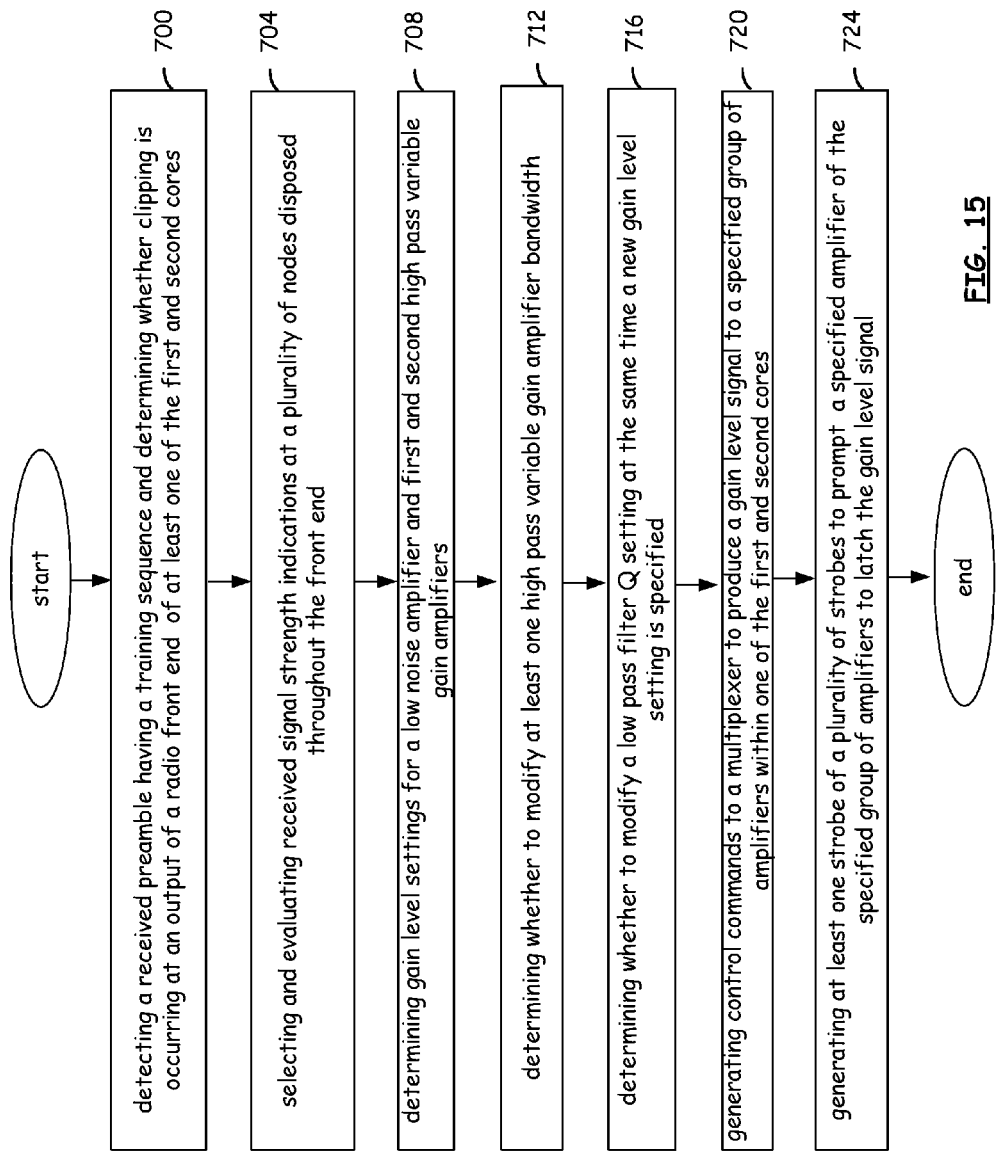
FIG. 15 is a flow chart illustrating a method according to one embodiment of the present invention.

FIG. 15 is a flow chart illustrating a method according to one embodiment of the present invention. Initially, a radio transceiver receives a data packet that includes a preamble having at least a short training sequence to allow the transceiver to adjust its receive path settings to accurately decode the ingoing signal. In one embodiment, the short training sequence is 16 micro-seconds in duration and is used for detection and gain control. In the described embodiment, the preamble also includes a long training sequence for other purposes including channel estimation and frequency offset estimation. Using short and long training sequences in a preamble for a non-synchronous data packet that is wirelessly transmitted is known by one of average skill in the art. Accordingly, the invention includes, in a radio transceiver having a plurality of cores, initially detecting a received preamble having a training sequence and determining whether clipping is occurring at an output of a radio front end of at least one of first and second cores (step 700). This step presumes that the radio transceiver includes a plurality of cores and may include more than two cores. The described embodiments of the invention include two cores, but it should readily be understood that the concepts disclosed herein may readily be applied to additional cores. In the described embodiment, a baseband processor initially determines whether clipping is occurring by determining a total signal strength at a node carrying a narrowband signal wherein clipping is presumed if the signal strength exceeds a specified threshold. The signal strength is evaluated by selecting a specified RSSI block operably coupled to a node disposed to pass the narrowband signal.

Thereafter, the invention includes selecting and evaluating received signal strength indications at a plurality of nodes disposed throughout the front end (step 704) for a specified front end core. More specifically, the nodes are disposed throughout a receive path within the front end core. Thereafter, the invention includes determining gain level settings for a low noise amplifier and for first and second high pass variable gain amplifiers within the receive path (step 708). The invention further includes determining whether to modify at least one high pass variable gain amplifier bandwidth (step 712). Generally, a reduced bandwidth for a high pass variable gain amplifier reduces the settle time for the amplifier.

Accordingly, the embodiments of the present invention include, for at least one high pass variable gain amplifier, selecting a reduced bandwidth whenever the gain level setting is being modified for the high pass variable gain amplifier. Similarly, the embodiment of the present invention includes determining whether to modify a low pass filter Q setting at the same time that a new gain level setting is specified (step 716).

In the described embodiment of the invention, there is at least one amplifier that is disposed upstream of the low pass filter. Further, in some embodiments, a pair of amplifiers are provided upstream of the low pass filter. For example, in the circuit of FIGS. 11 and 12, a low noise amplifier, as well as a high pass variable gain amplifier are disposed upstream of the low pass filter. Accordingly, for this embodiment, if the gain signal includes changes to the gain level settings of either of the low noise amplifier or the high pass variable gain amplifier that is disposed upstream of the low pass filter, then the described method will include modifying the high pass variable gain amplifier bandwidth and the low pass filter Q setting during the period in which the gain is being adjusted.

In addition to making these determinations, the invention includes generating control commands to a multiplexer to produce the gain level signal to a specified group of amplifiers within one of the first and second cores (step 720). At the same time that the gain control commands are produced to the multiplexer, any required Q settings or bandwidth settings are produced at the same time. Subsequently, the Q setting and the bandwidth setting are restored to their original value to provide the improved filtering that is associated with the original values. Finally, at the same time that the various control commands and gain level settings are produced, the invention includes generating at least one strobe of a plurality of strobes to prompt the corresponding amplifiers of the specified group of amplifiers to latch the gain level signal as well, if necessary, as the Q select signal and the high pass variable gain amplifier bandwidth signal (step 724).

Step 724 specifically states that at least one strobe is set to prompt a specified amplifier at a specified group of amplifiers to latch the gain level signal. As has been described herein, a radio transceiver includes in-phase and quadrature phase circuits, as well as first and second cores both containing the in-phase and quadrature phase circuits. Additionally, each receive path includes at least one low noise amplifier and at least two high pass variable gain amplifiers disposed within the receive path. Accordingly, each defined strobe relates to a plurality of amplification devices within the various in-phase and quadrature phase receive paths of the first and second cores.

Figure 16:
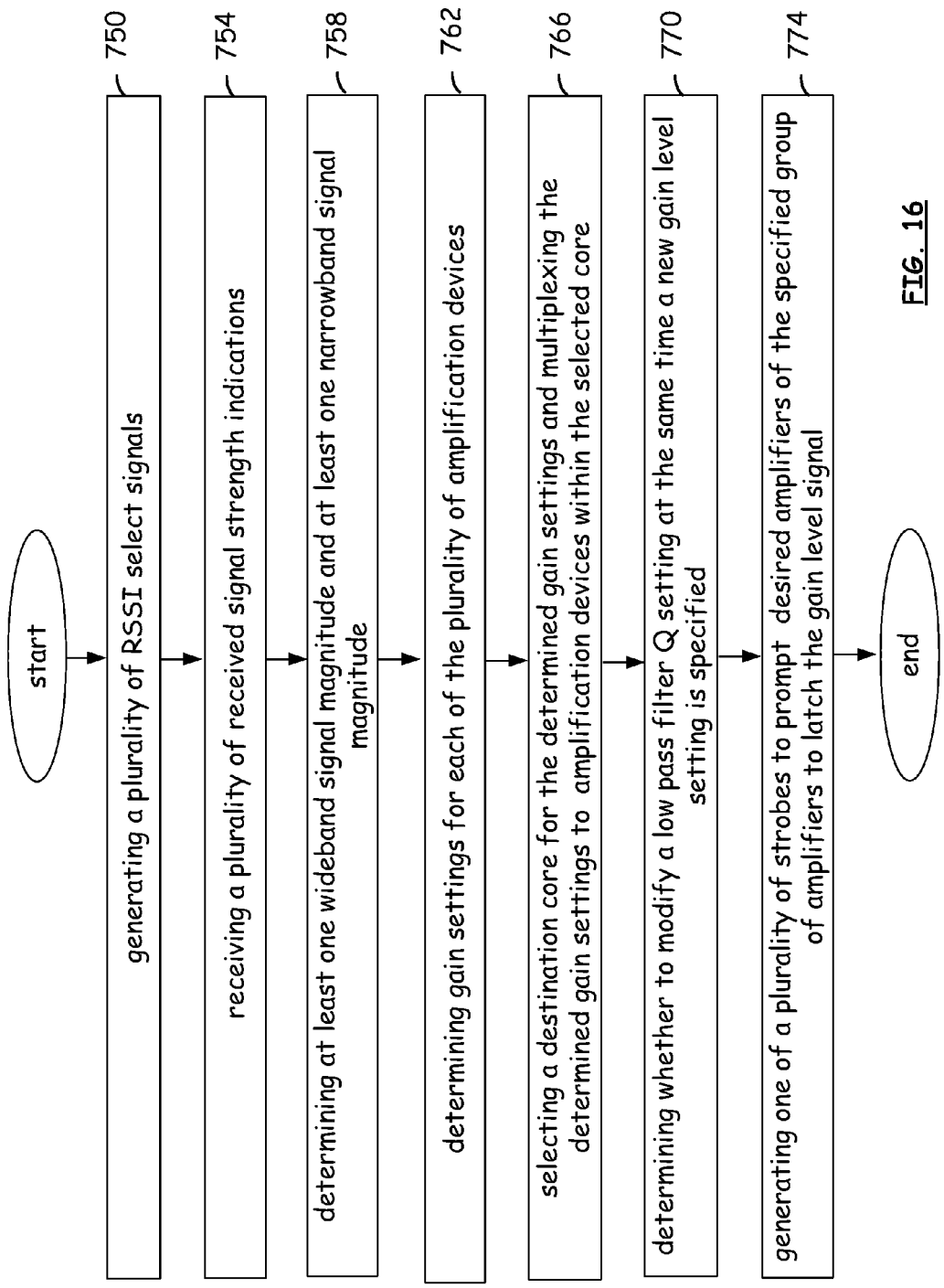
FIG. 16 is a flow chart illustrating operation accordingly to one embodiment of the present invention.

FIG. 16 is a flow chart illustrating operation according to one embodiment of the present invention. Initially, the inventive method includes generating a plurality of RSSI select signals that, in the described embodiments of the invention, are multiplexed to all cores and are maintained continuously coupled to all cores (step 750). Thereafter, the invention includes receiving a plurality of received signal strength indications (step 754) and determining at least one wideband signal magnitude and at least one narrowband signal magnitude (step 758). These signal magnitudes are determined from nodes disposed within the receive paths and the references to wideband and narrowband relate to being either upstream or downstream of a low pass filter, respectively. The inventive method further includes determining gain settings for each of the plurality of amplification devices disposed within each receive path of the radio transceiver based upon the received signal strength indications (step 762). Once the gain settings are determined, the inventive method includes selecting a destination core for the determined gain settings and multiplexing the determined gain settings to amplification devices within the selected core (step 766). Thereafter, according to whether amplification levels were modified for amplifiers upstream of a low pass filter, the inventive method includes determining whether to modify a low pass filter Q setting at the same time that a new gain level setting is specified (step 770). Finally, the invention includes generating one of a plurality of strobes to prompt the desired amplifiers of the specified group of amplifiers to latch the gain level signal which has been multiplexed thereto (step 774). It should be understood that additional steps described elsewhere may be included herein. For example, if a high pass variable gain amplifier upstream of the low pass filter is to receive a modified gain level setting, the inventive method could include specifying a new (narrower) bandwidth to provide a faster settle time therefor. Moreover, the embodiment of the invention specifically includes some steps being repeated if necessary. For example, steps 766-774 may be repeated for any one of the cores without necessarily repeating other prior steps.

The embodiments of the present invention strike a balance between interface bandwidth and system settle time by defining interface elements that are dedicated from one baseband processor to associated elements on one of a plurality of front end cores and by defining interface elements that are multiplexed or switched from the baseband processor to associated elements on the plurality of front end cores. To facilitate this design, a core select signal having multiple values is used in conjunction with a plurality of strobes to specify what elements of the plurality of front end cores are to latch specified signals. Because multiple elements may be associated with a unique combination of the core select signal value and strobe, the baseband processor must perform some bookkeeping to reset interface value either to a new value or to a previously transmitted value (as if the value were being changed).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A wireless communication device, comprising:
   a baseband processor for processing ingoing and outgoing digital communication signals;
   a plurality of processing cores for transmitting and receiving radio frequency (RF) signals wherein each processing core includes a receiver front end and a transmitter front end;
   the receiver front end of each processing core further including:
      a plurality of filtering and amplification blocks disposed within an ingoing signal path; and
      a plurality of received signal strength indicator (RSSI) blocks coupled to receive an ingoing analog signal from a corresponding plurality of nodes disposed throughout the in going signal path, each of the plurality of received signal strength indicator blocks producing a signal strength indication; and
   a gain control bus operably coupled to the plurality of filtering and amplification blocks for carrying gain control commands to the plurality of filtering and amplification blocks within each of the plurality of processing cores.

2. The wireless communication device of claim 1, further comprising:
   a multiplexer having a plurality of inputs coupled to the plurality of RSSI blocks and an output; and
   an Analog to Digital Convert (ADC) having an input coupled to the output of the multiplexer and an output coupled to the baseband processor, the multiplexer operable to selectively couple a selected signal strength indication to the ADC input.

3. The wireless communication device of claim 1 further including a multiplexed low-pass filter bandwidth select signal that is multiplexed to low pass filters operably disposed in the receive paths of the plurality of processing cores.

4. The wireless communication device of claim 1 further including a dedicated low-pass filter Q select signal produced to at least one low pass filter within each of the processing cores.

5. The wireless communication device of claim 1 further including a dedicated high-pass bandwidth select signal produced to at least one high-pass variable gain amplifier within the processing cores.

6. The wireless communication device of claim 1 wherein the baseband processor generates a plurality of strobes to a plurality of circuit blocks within the processing cores.

7. The wireless communication device of claim 1 wherein the baseband processor is operable to change a low pass filter Q for a low pass filter on one of the first and second cores whenever a gain setting is modified for an upstream amplifier.

8. The wireless communication device of claim 7 wherein the upstream amplifier is one of a low noise amplifier and a high pass variable gain amplifier.

9. The wireless communication device of claim 1 wherein the baseband processor is operable to change a low pass filter Q on one of the plurality of cores when a bandwidth is modified for an upstream high pass variable gain amplifier.

10. The wireless communication device of claim 1 wherein the baseband processor is operable to decrease a low pass filter Q upon a specified change to an amplifier gain or bandwidth for an amplifier disposed upstream of a low pass filter.

11. The wireless communication device of claim 1, wherein the plurality of processing cores support Multiple Input Multiple Output (MIMO) communications.

12. The wireless communication device of claim 1, wherein the plurality of processing cores support at least one of cellular communications and Wireless Local Area Network (WLAN) communications.

13. A wireless communication device, comprising:
   a baseband processor;
   first and second RF front ends coupled to the baseband processor, each further comprising a transmitter front end and a receiver front end;
   at least one antenna coupled to the first and second front ends;
   a plurality of amplifiers and filters operably disposed in receive paths of each of the first and second front end cores;
   a baseband processor-to-multi-core interface operable to receive ingoing signals and received signal strength indications from the receiver front ends of the first and second front end cores and operable to produce control commands and a plurality of strobes to control data latching to receiver front end amplifiers and filters of the first and second front end cores; and
   a gain control bus operably coupled to carry control commands and the plurality of strobes to filtering and amplification blocks within each of the first and second front end cores.

14. The wireless communication device of claim 13 further including a multiplexed bandwidth select signal path operable to conduct a first bandwidth select signal to a plurality of filters.

15. The wireless communication device of claim 13 further including at least one dedicated bandwidth select signal path operable to directly conduct a second bandwidth select signal path to a corresponding filter disposed on one of the first and second front end cores.

16. The wireless communication device of claim 13 further including a plurality of strobe signal paths operable to directly conduct one of a plurality of strobes to prompt associated circuit elements to latch data.

17. The wireless communication device of claim 13 wherein the baseband processor includes associated logic for:
   detecting a received preamble having a training sequence;
   during the training sequence, determining whether clipping is occurring at an output of a radio front end of at least one of the first and second front end cores;

selecting and evaluating received signal strength indications at a plurality of nodes disposed throughout the radio front end;

determining gain level settings for a low noise amplifier and first and second high pass variable gain amplifiers;

determining whether to modify at least one high pass variable gain amplifier bandwidth;

determining whether to modify a low pass filter Q setting at the same time a new gain level setting is specified;

generating control commands to a multiplexer to produce a gain level signal to a specified group of amplifiers within one of the first and second front end cores; and generating at least one strobe of a plurality of strobes to prompt a specified amplifier of the specified group of amplifiers to latch the gain level signal.

18. The wireless communication device of claim 17 wherein the baseband processor further includes logic for determining whether to front end load or back end load a portion of total gain.

19. The wireless communication device of claim 13, wherein the first and second RF front ends support Multiple Input Multiple Output (MIMO) communications.

20. The wireless communication device of claim 13, wherein the first and second RF front ends support at least one of cellular communications and Wireless Local Area Network (WLAN) communications.

* * * * *